US012677455B2

(12) United States Patent
Kung et al.

(10) Patent No.: US 12,677,455 B2
(45) Date of Patent: Jul. 7, 2026

(54) TRANSISTOR DEVICE HAVING A GATE SETBACK FROM A GATE DIELECTRIC

(71) Applicant: Taiwan Semiconductor Manufacturing Company, Ltd., Hsinchu (TW)

(72) Inventors: Ta-Yuan Kung, New Taipei City (TW); Chen-Liang Chu, Hsin-Chu (TW); Chih-Wen Albert Yao, Hsinchu City (TW); Fei-Yun Chen, Hinchu (TW); Ming-Ta Lei, Hsin-Chu City (TW); Ruey-Hsin Liu, Hsin-Chu (TW); Yu-Chang Jong, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 564 days.

(21) Appl. No.: 18/162,854

(22) Filed: Feb. 1, 2023

(65) Prior Publication Data

US 2024/0258373 A1 Aug. 1, 2024

(51) Int. Cl.
H10D 62/13 (2025.01)
H10D 30/01 (2025.01)
(Continued)

(52) U.S. Cl.
CPC ....... H10D 62/151 (2025.01); H10D 30/0285 (2025.01); H10D 30/601 (2025.01);
(Continued)

(58) Field of Classification Search
CPC ............. H10D 62/151; H10D 30/0285; H10D 30/601; H10D 62/126; H10D 64/671;
(Continued)

(56) References Cited

U.S. PATENT DOCUMENTS 8,587,056 B2 11/2013 Lee et al.
2006/0076617 A1 4/2006 Shenoy et al.
(Continued)

FOREIGN PATENT DOCUMENTS

CN 114242774 A * 3/2022 ........... H10D 30/655

OTHER PUBLICATIONS

Liu et al. "The Investigation of Field Plate Design in 500V High Voltage NLDMOS" Advances in Condensed Matter Physics, vol. 2015, Article ID 834545, 6 pages, published on Apr. 23, 2015.
(Continued)

*Primary Examiner* — Shahed Ahmed
(74) *Attorney, Agent, or Firm* — Eschweiler & Potashnik, LLC

(57) ABSTRACT

An integrated chip including a first source/drain region and a second source/drain region in a semiconductor substrate and laterally spaced apart along a top surface of the substrate. A gate dielectric layer is over the substrate and extends laterally between the first source/drain region and the second source/drain region. A thickness of the gate dielectric layer along a first sidewall of the gate dielectric layer is less than an average thickness of the gate dielectric layer. A trench isolation layer extends along gate dielectric layer. A first sidewall of the trench isolation layer extends along the first sidewall of the gate dielectric layer. A gate layer is directly over the gate dielectric layer and between the first source/drain region and the second source/drain region. A first sidewall of the gate layer is directly over the gate dielectric layer and laterally setback from the first sidewall of the gate dielectric layer.

20 Claims, 16 Drawing Sheets

(51) Int. Cl.

| | |
|---|---|
| *H10D 30/60* | (2025.01) |
| *H10D 62/10* | (2025.01) |
| *H10D 64/00* | (2025.01) |
| *H10D 64/66* | (2025.01) |
| *H10P 50/00* | (2026.01) |

(52) U.S. Cl.
CPC ......... *H10D 62/126* (2025.01); *H10D 64/111* (2025.01); *H10D 64/671* (2025.01); *H10P 50/00* (2026.01)

(58) Field of Classification Search
CPC . H10D 30/0221; H10D 30/0281–0289; H10D 30/65–659; H10D 62/156–159; H10D 64/111–117; H01L 21/302; H01L 21/76224–76237
See application file for complete search history.

(56) References Cited

U.S. PATENT DOCUMENTS

| | | | |
|---|---|---|---|
| 2015/0060875 A1 | 3/2015 | Kume et al. | |
| 2015/0270360 A1 | 9/2015 | Lee | |
| 2020/0126990 A1* | 4/2020 | Zhang | H10D 30/603 |
| 2022/0102518 A1* | 3/2022 | Chen | H01L 21/76224 |
| 2025/0004034 A1* | 1/2025 | Coyne | G01R 31/2858 |

OTHER PUBLICATIONS

Fan et al. "Layout Strengthening the ESD Performance for High-Voltage N-Channel Lateral Diffused MOSFETs" Electronics 2020, 9, 718; doi: 10.3390/electronics9050718, published on Apr. 27, 2020.

\* cited by examiner

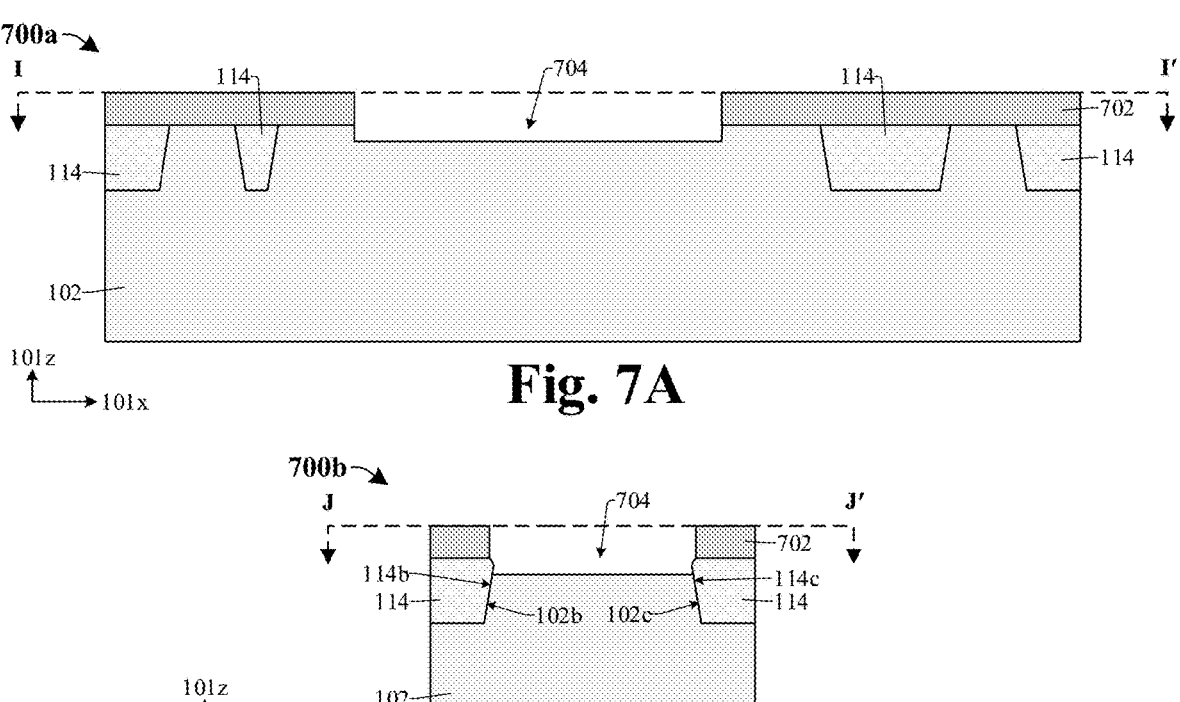
Fig. 7A
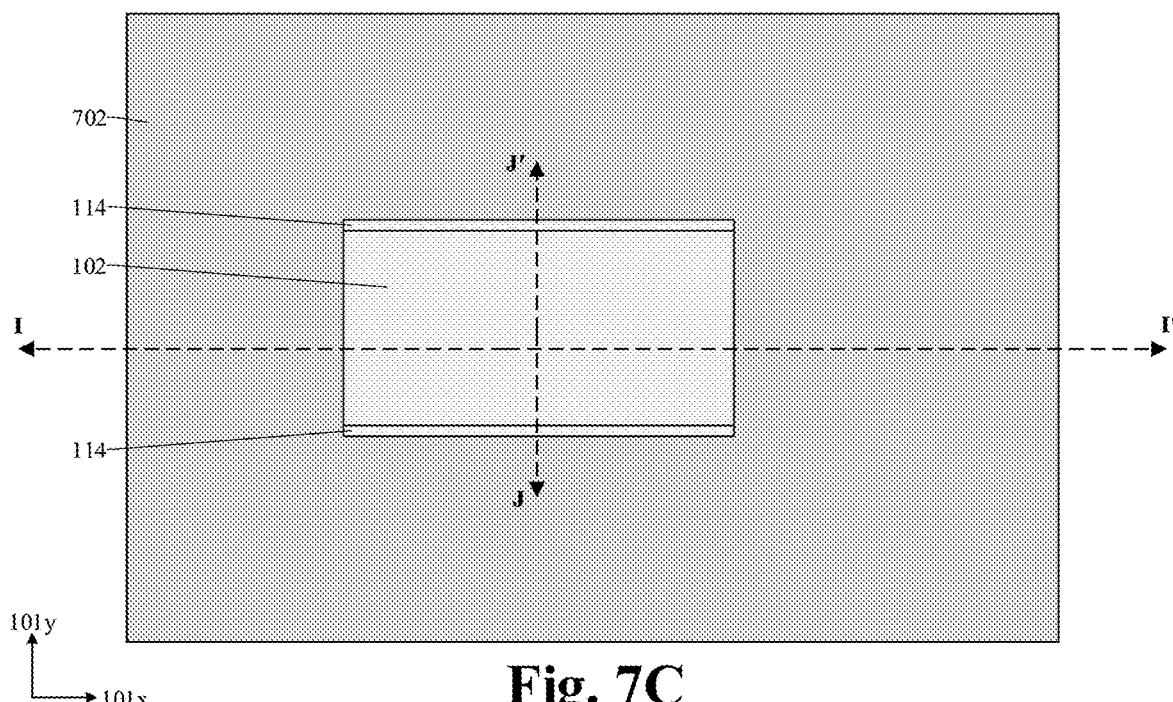
Fig. 7B
Fig. 7C

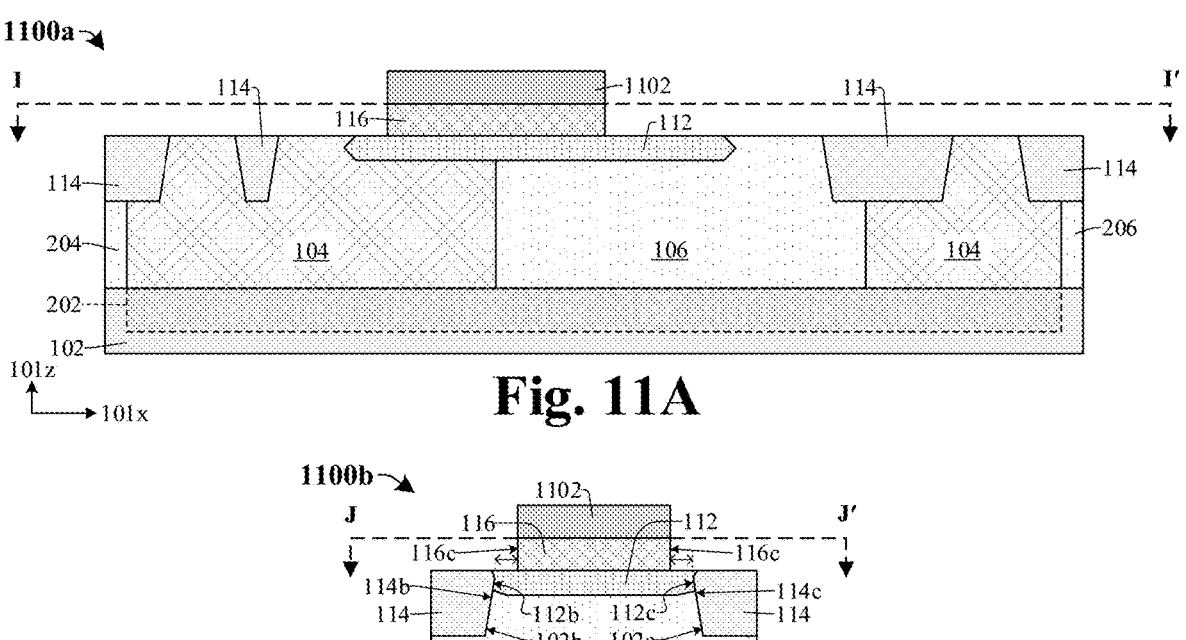
Fig. 11A
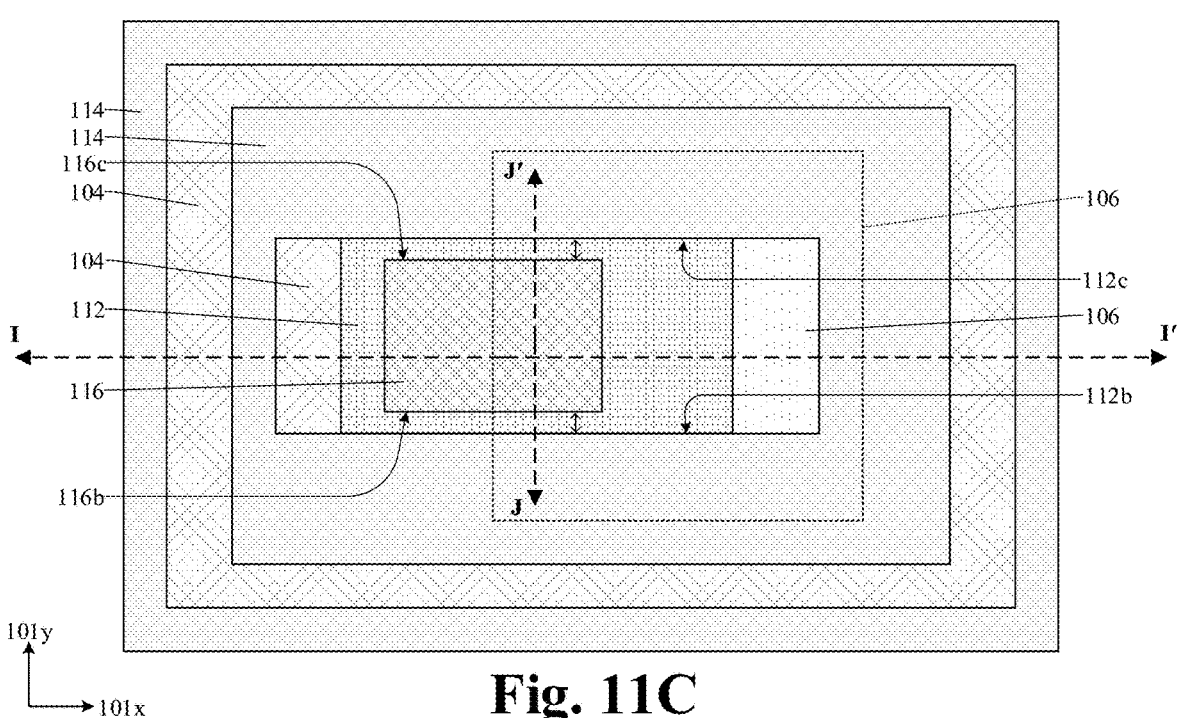
Fig. 11B
Fig. 11C

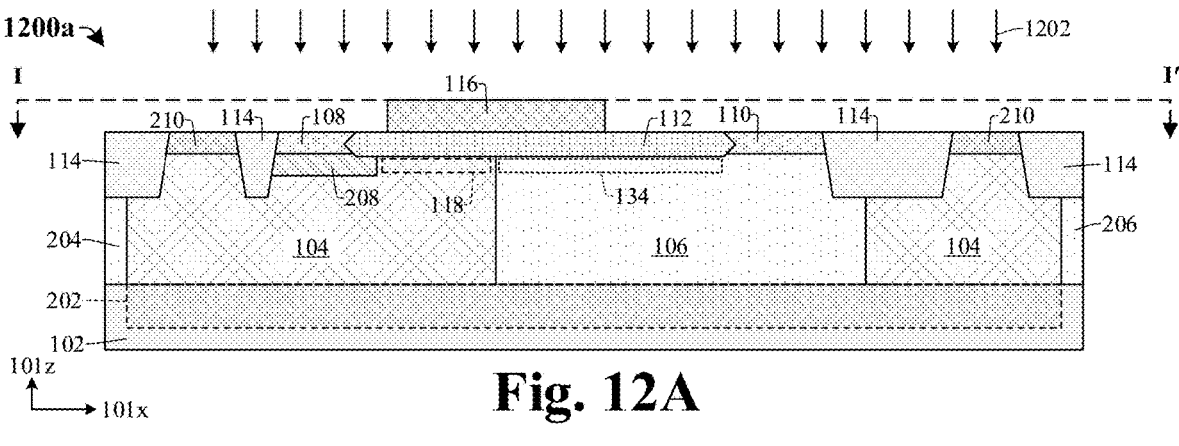
Fig. 12A
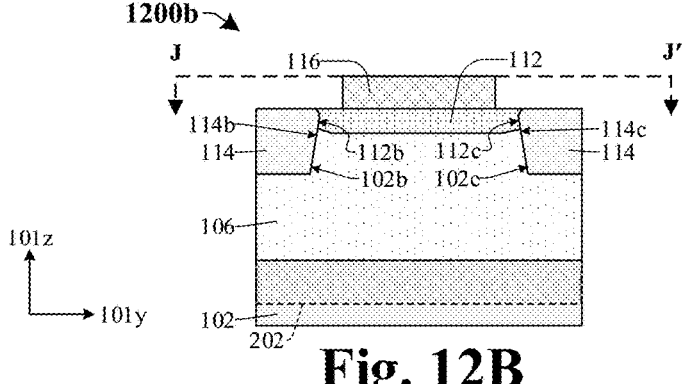
Fig. 12B
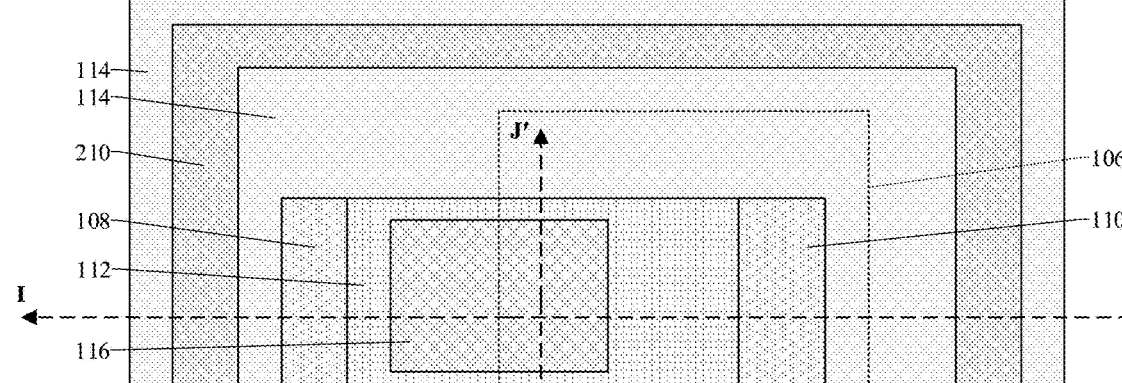
Fig. 12C
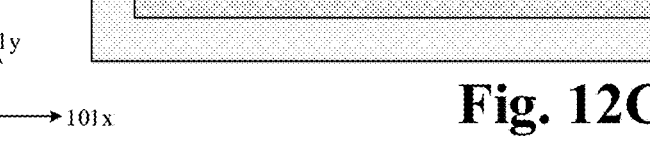

1600 ⟶

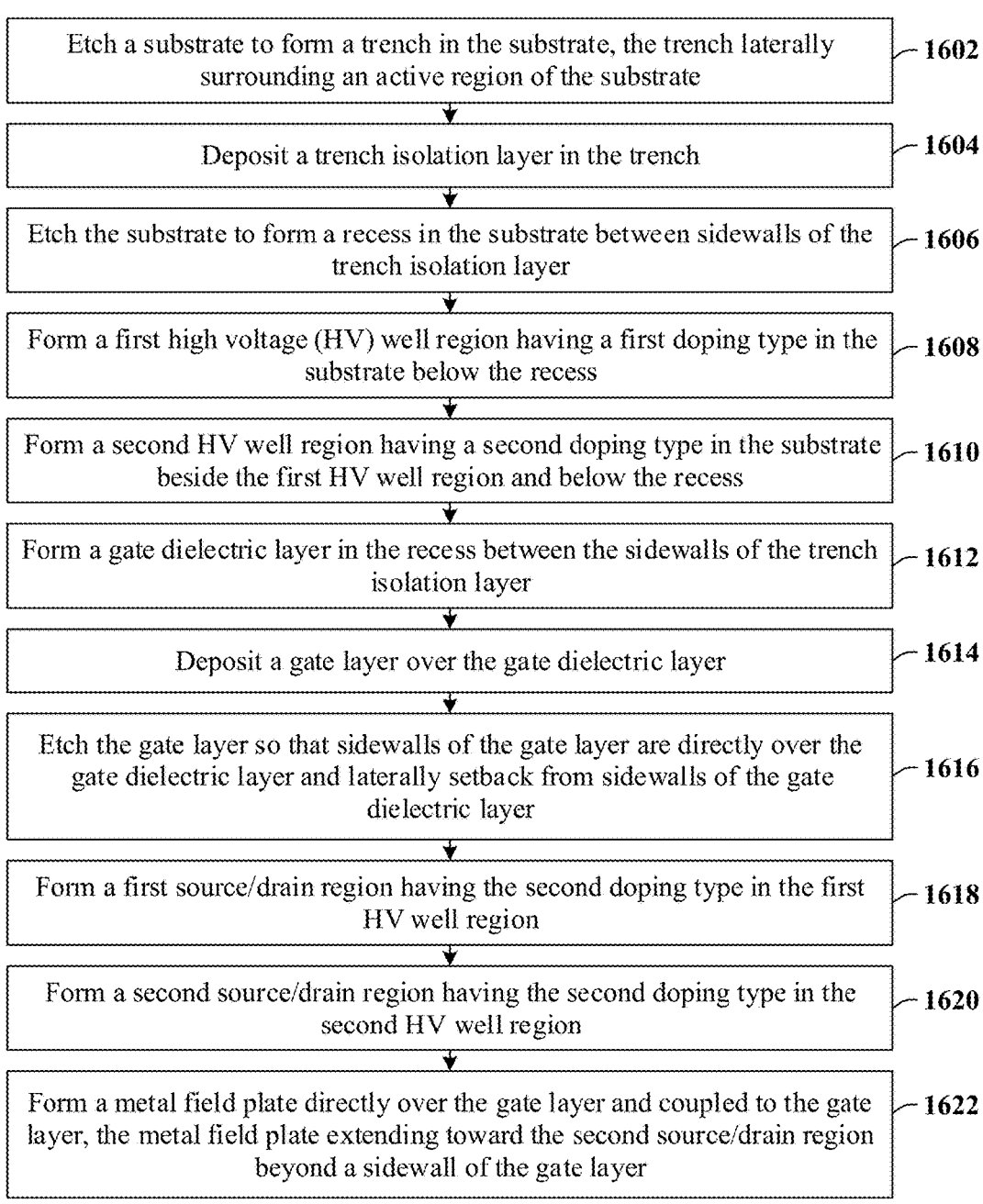

Etch a substrate to form a trench in the substrate, the trench laterally surrounding an active region of the substrate ⟶ 1602

Deposit a trench isolation layer in the trench ⟶ 1604

Etch the substrate to form a recess in the substrate between sidewalls of the trench isolation layer ⟶ 1606

Form a first high voltage (HV) well region having a first doping type in the substrate below the recess ⟶ 1608

Form a second HV well region having a second doping type in the substrate beside the first HV well region and below the recess ⟶ 1610

Form a gate dielectric layer in the recess between the sidewalls of the trench isolation layer ⟶ 1612

Deposit a gate layer over the gate dielectric layer ⟶ 1614

Etch the gate layer so that sidewalls of the gate layer are directly over the gate dielectric layer and laterally setback from sidewalls of the gate dielectric layer ⟶ 1616

Form a first source/drain region having the second doping type in the first HV well region ⟶ 1618

Form a second source/drain region having the second doping type in the second HV well region ⟶ 1620

Form a metal field plate directly over the gate layer and coupled to the gate layer, the metal field plate extending toward the second source/drain region beyond a sidewall of the gate layer ⟶ 1622

Fig. 16

TRANSISTOR DEVICE HAVING A GATE SETBACK FROM A GATE DIELECTRIC

BACKGROUND

Modern day integrated chips (ICs) comprise millions or billions of semiconductor devices formed on a semiconductor substrate (e.g., silicon). Integrated chips may use many different types of semiconductor devices, depending on an application of an IC. For example, many integrated chips include high voltage transistor devices. High voltage transistor devices are often used in power electronics due to their ability to handle high breakdown voltages (e.g., greater than about 25V).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A, 5B, 5C through FIGS. 15A, 15B, 15C illustrate views of some embodiments of a method for forming an integrated chip including a high voltage (HV) transistor device, the HV transistor device including a gate layer that is setback from sidewalls of a gate dielectric layer.

FIG. 16 illustrates a flow diagram of some embodiments of a method for forming an integrated chip including a high voltage (HV) transistor device, the HV transistor device including a gate layer that is setback from sidewalls of a gate dielectric layer.

DETAILED DESCRIPTION

Figure 1A:
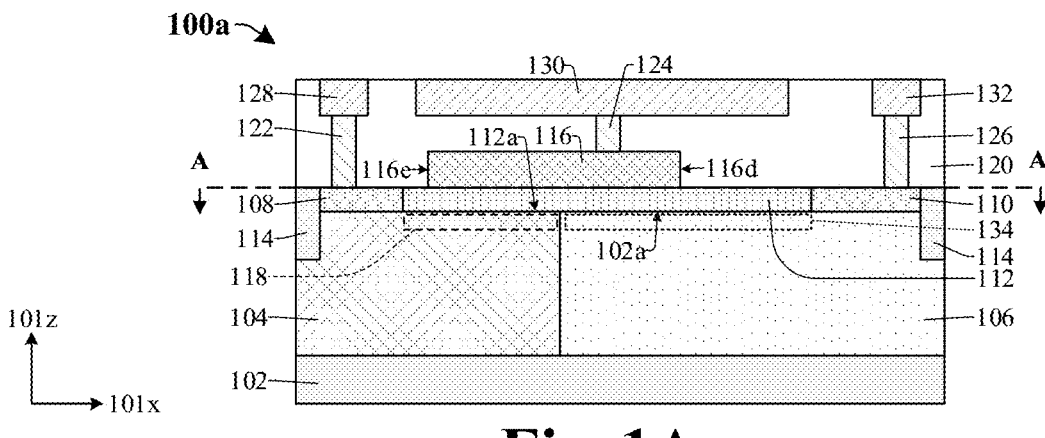
FIGS. 1A-1C illustrate views of some embodiments of an integrated chip including a high voltage (HV) transistor device, the HV transistor device including a gate layer that is setback from sidewalls of a gate dielectric layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A high voltage (HV) transistor device includes a first source/drain region and a second source/drain region in a semiconductor substrate. The second source/drain region is laterally spaced apart from the first source/drain region. A gate dielectric layer overlies the substrate and is laterally between the first source/drain region and the second source/drain region. A trench isolation layer surrounds the first source/drain region, the second source/drain region, and the gate dielectric layer. Sidewalls of the trench isolation layer extend along sidewalls of the gate dielectric layer. A gate layer is over the gate dielectric layer and extends over the sidewalls of the gate dielectric layer and over the trench isolation layer.

In some devices, a thickness of the gate dielectric layer is reduced along the sidewalls of the gate dielectric layer where the gate dielectric layer borders the trench isolation layer. Because the gate layer extends over the sidewalls of the gate dielectric layer where the thickness of the gate dielectric layer is reduced, the minimum distance between the gate layer and the substrate may be reduced. Consequently, a reliability of the HV transistor device may be reduced. For example, a gate oxide integrity (GOI) and/or a breakdown voltage of the HV transistor device may be reduced.

In various embodiments of the present disclosure, sidewalls of the gate layer are setback from the sidewalls of the gate dielectric layer and the sidewalls of the trench isolation layer to improve the reliability of the HV transistor device. For example, sidewalls of the gate layer are directly over the gate dielectric layer and laterally offset from the sidewalls of the gate dielectric layer. Because the sidewalls of the gate layer are setback from the sidewalls of the gate dielectric layer, the gate layer does not extend over the portions of the gate dielectric layer that have the reduced thickness. Thus, the minimum distance between the gate layer and the substrate can be increased. As a result, a reliability of the HV transistor device may be improved.

Figure 1B:
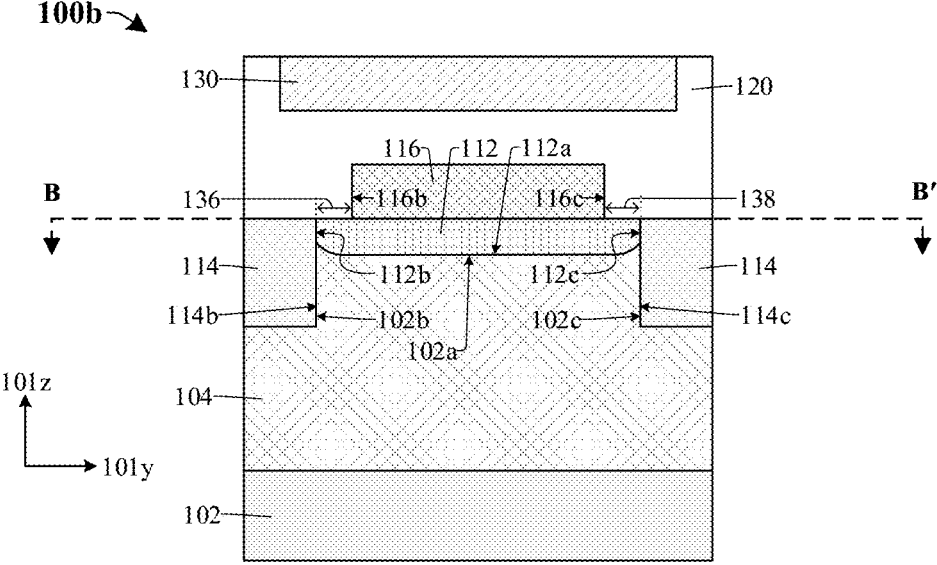
Figure 1C:
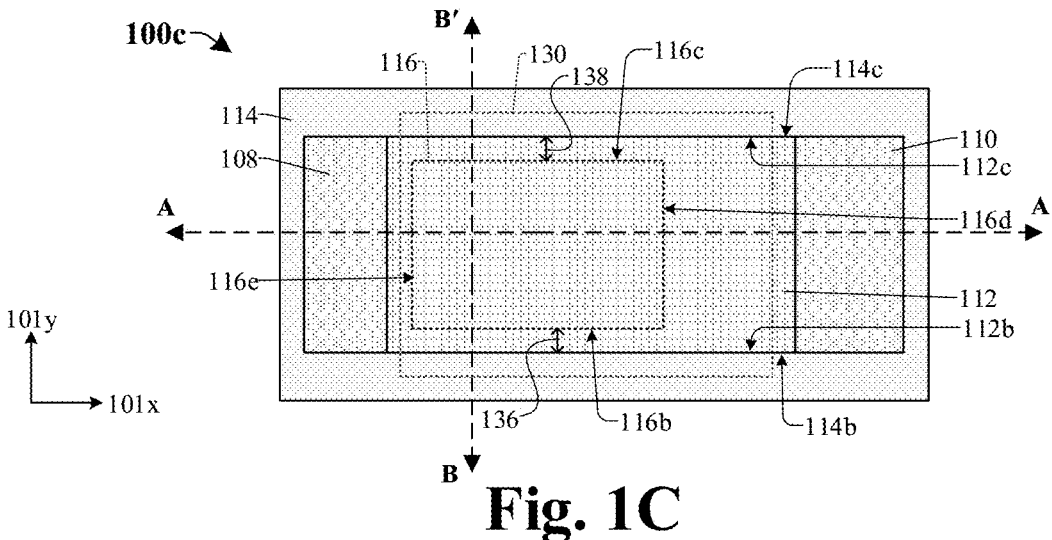

FIG. 1A illustrates a first cross-sectional view 100a of some embodiments of an integrated chip including a high voltage (HV) transistor device, the HV transistor device including a gate layer 116 that is setback from sidewalls of a gate dielectric layer 112. FIG. 1B illustrates a second cross-sectional view 100b of some embodiments of the integrated chip of FIG. 1A. FIG. 1C illustrates a top view 100c of some embodiments of the integrated chip of FIG. 1A and FIG. 1B.

In some embodiments, cross-sectional view 100a of FIG. 1A may be taken across line A-A' of FIG. 1C and/or top view 100c of FIG. 1C may be taken across line A-A' of FIG. 1A. In some embodiments, cross-sectional view 100b of FIG. 1B may be taken across line B-B' of FIG. 1C and/or top view 100c of FIG. 1C may be taken across line B-B' of FIG. 1B. In some embodiments, cross-sectional view 100a of FIG. 1A is illustrated in a x-z plane formed by x-axis $101x$ and z-axis $101z$, cross-sectional view 100b of FIG. 1B is illustrated in a y-z plane formed by y-axis 101$y$ and z-axis 101$z$, and top view 100$c$ of FIG. 1C is illustrated in a x-y plane formed by x-axis 101$x$ and y-axis 101$y$.

The integrated chip includes a semiconductor substrate 102. A first high voltage (HV) well region 104 is in the substrate 102. The first HV well region 104 has a first doping type. A second HV well region 106 is in the substrate 102 beside the first HV well region 104. The second HV well region 106 has a second doping type, different than the first doping type. A first source/drain region 108 is in the first HV well region 104. A second source/drain region 110 is in the second HV well region 106. The first source/drain region 108 and the second source/drain region 110 have the second doping type. Source/drain region(s) may refer to a source or a drain, individually or collectively dependent upon the context. In some embodiments, the first doping type is p-type and the second doping type is n-type. In some other embodiments, the first doping type is n-type and the second doping type is p-type.

The second source/drain region 110 is laterally spaced apart from the first source/drain region in a first direction (e.g., along x-axis 101$x$). The substrate 102 has a upper surface 102$a$ and a pair of sidewalls (e.g., a first sidewall 102$b$ and a second sidewall 102$c$) on opposite sides of the upper surface 102$a$. The upper surface 102$a$ and the sidewalls 102$b$, 102$c$ extend in the first direction from the first source/drain region 108 to the second source/drain region 110. The sidewalls 102$b$, 102$c$ are laterally spaced apart in a second direction (e.g., along y-axis 101$y$), different than the first direction (e.g., approximately perpendicular to the first direction).

A channel region 118 extends laterally along the upper surface 102$a$ of the substrate 102 from the first source/drain region 108 to an interface between the first HV well region 104 and the second HV well region 106. A drift region 134 extends along the upper surface of the substrate 102 from the second source/drain region 110 to the interface between the first HV well region 104 and the second HV well region 106.

A gate dielectric layer 112 is over first HV well region 104 and the second HV well region 106. The gate dielectric layer 112 extends laterally between the first source/drain region 108 and the second source/drain region 110. The gate dielectric layer 112 has a bottom surface 112$a$ and a pair of sidewalls (e.g., a first sidewall 112$b$ and a second sidewall 112$c$) on opposite sides of the bottom surface 112$a$. The sidewalls 112$b$, 112$c$ extend in the first direction (e.g., along x-axis 101$x$) and are laterally spaced apart in the second direction (e.g., along y-axis 101$y$). The bottom surface 112$a$ of the gate dielectric layer 112 extends along the upper surface 102$a$ of the substrate 102 from the first source/drain region 108 to the second source/drain region 110.

A trench isolation layer 114 (e.g., a shallow trench isolation (STI) layer) laterally surrounds the first source/drain region 108, the second source/drain region 110, and the gate dielectric layer 112 in a closed path (e.g., a ring shaped path). In some embodiments, the trench isolation layer 114 delimits an active region (e.g., an oxide defined (OD) region) of the HV transistor device. The trench isolation layer 114 extends along the gate dielectric layer 112 on opposite sides of the gate dielectric layer 112. For example, the trench isolation layer 114 has a first sidewall 114$b$ and a second sidewall 114$c$ that extend in the first direction along the first sidewall 112$b$ and the second sidewall 112$c$ of the gate dielectric layer, respectively. The first sidewall 114$b$ and the second sidewall 114$c$ of the trench isolation layer 114 are laterally spaced apart in the second direction (e.g., 101$y$).

A gate layer 116 is directly over the gate dielectric layer 112 and laterally between the first source/drain region 108 and the second source/drain region 110. The gate layer 116 has a first sidewall 116$b$ and a second sidewall 116$c$ that extend in the first direction (e.g., 101$x$) and that are laterally spaced apart in the second direction (e.g., 101$y$). The first sidewall 116$b$ and the second sidewall 116$c$ are directly over the gate dielectric layer 112 and the upper surface 102$a$ of the substrate 102.

In some embodiments, the thickness (e.g., along z-axis 101$z$) of the gate dielectric layer 112 is reduced along the sidewalls 112$b$, 112$c$ of the gate dielectric layer 112 where the gate dielectric layer 112 borders the trench isolation layer 114. For example, in some embodiments, the thickness of the gate dielectric layer 112 along the sidewalls 112$b$, 112$c$ of the gate dielectric layer 112 is substantially less than an average thickness of the gate dielectric layer 112. Thus, in embodiments of the present disclosure, the gate layer 116 is setback from the sidewalls 112$b$, 112$c$ of the gate dielectric layer 112 (where the thickness of the gate dielectric layer 112 is reduced). For example, the first sidewall 116$b$ of the gate layer 116 is directly over the gate dielectric layer 112 and laterally offset (e.g., spaced apart) from the first sidewall 112$b$ of the gate dielectric layer 112 in the second direction. Similarly, the second sidewall 116$c$ of the gate layer 116 is directly over the gate dielectric layer 112 and laterally offset (e.g., spaced apart) from the second sidewall 112$c$ of the gate dielectric layer 112 in the second direction.

By offsetting the sidewalls 116$b$, 116$c$ of the gate layer 116 from the respective sidewalls 112$b$, 112$c$ of the gate dielectric layer 112, the gate layer 116 does not extend directly over the sidewalls 112$b$, 112$c$ of the gate dielectric layer 112 where the thickness of the gate dielectric layer 112 is reduced. Thus, the minimum distance between the gate layer 116 and the substrate 102 can be increased. As a result, a reliability of the HV transistor device may be improved. For example, the gate oxide integrity (GOI) and/or the breakdown voltage of the HV transistor device may be improved. Further, because the gate layer 116 does not extend directly over the sidewalls 112$b$, 112$c$ of the gate dielectric layer 112, an electric field at the edges of the substrate where the sidewalls 102$b$, 102$c$ meet the upper surface 102$a$ can be reduced. As a result, the GOI may be further improved.

Further, the gate layer 116 has a third sidewall 116$d$ and a fourth gate sidewall 116$e$ that extend in the second direction between the first sidewall 116$b$ and the second sidewall 116$c$ and that are laterally spaced apart in the first direction. The third sidewall 116$d$ is directly over the gate dielectric layer 112 and the second HV well region 106. The trench isolation layer 114 does not extend directly under the third sidewall 116$d$ of the gate layer 116 between the first source/drain region 108 and the second source/drain region 110. Instead, the gate dielectric layer 112 extends continuously from the first source/drain region 108 to the second source/drain region 110.

Because the trench isolation layer 114 does not extend directly under the third sidewall 116$d$ of the gate layer 116, the thickness of the gate dielectric layer 112 directly under the third sidewall 116$d$ of the gate layer 116 may not be reduced. Thus, the minimum distance between the gate layer 116 and the substrate 102 may not be reduced. As a result, a reduction of the GOI along the third sidewall 116$d$ of the gate layer 116 may be avoided. Furthermore, because the trench isolation layer 114 does not does not extend directly between the first source/drain region 108 and the second source/drain region 110, a current through the HV transistor device may be improved.

A dielectric structure 120 comprising one or more dielectric layers is over the substrate 102. A first metal interconnect 128 is coupled to the first source/drain region 108 by a first source/drain contact 122. A second metal interconnect 132 is coupled to the second source/drain region 110 by a second source/drain contact 126. A metal field plate 130 is directly over the gate layer 116 and coupled to the gate layer 116 by a gate contact 124. The metal field plate 130 covers the gate layer 116. For example, the metal field plate 130 extends from directly over the gate layer 116 to beyond a perimeter (e.g., beyond the sidewalls 116*b*, 116*c*, 116*d*) of the gate layer 116. In particular, the metal field plate 130 extends beyond the third sidewall 116*d* of the gate layer directly over the second HV well region 106 and the drift region 134. In some embodiments, the metal field plate 130 extends directly over the second source/drain region 110.

By including the metal field plate 130 over the gate layer 116 and the drift region 134, the electric field distribution in the HV well regions 104, 106 can be improved. For example, a peak electric field in the drift region 134 can be reduced. As a result, the breakdown voltage of the HV transistor device can be improved.

In some embodiments, the lateral distance 136 between the first sidewall 116*b* of the gate layer 116 and the first sidewall 112*b* of the gate dielectric layer 112 is large enough that the first sidewall 116*b* of the gate layer 116 is laterally spaced from the first portion of the gate dielectric layer 112 having the reduced thickness (e.g., along the first sidewall 112*b* of the gate dielectric layer 112). Similarly, the lateral distance 138 between the second sidewall 116*c* of the gate layer 116 and the second sidewall 112*c* of the gate dielectric layer 112 is large enough that the second sidewall 116*c* of the gate layer 116 is laterally spaced from the second portion of the gate dielectric layer 112 having the reduced thickness (e.g., along the second sidewall 112*c* of the gate dielectric layer 112). If the distances 136, 138 are too small, the gate layer 116 may extend over the portions of the gate dielectric layer 112 having the reduced thickness and thus the GOI of the HV transistor device may be reduced.

In some embodiments, a thickness of the gate dielectric layer 112 ranges from 900 to 500 angstroms, from 800 to 600 angstroms, or some other suitable value. In some embodiments, because the gate layer 116 does not extend directly over the sidewalls 112*b*, 112*c* of the gate dielectric layer 112, the average the thickness of the gate dielectric layer 112 can be reduced (e.g., relative to a gate dielectric layer having an increased average thickness to compensate for the thickness reduction along the sidewalls). As a result, the current through the HV transistor device may be further improved.

Figures 2A, 2B, 2C:
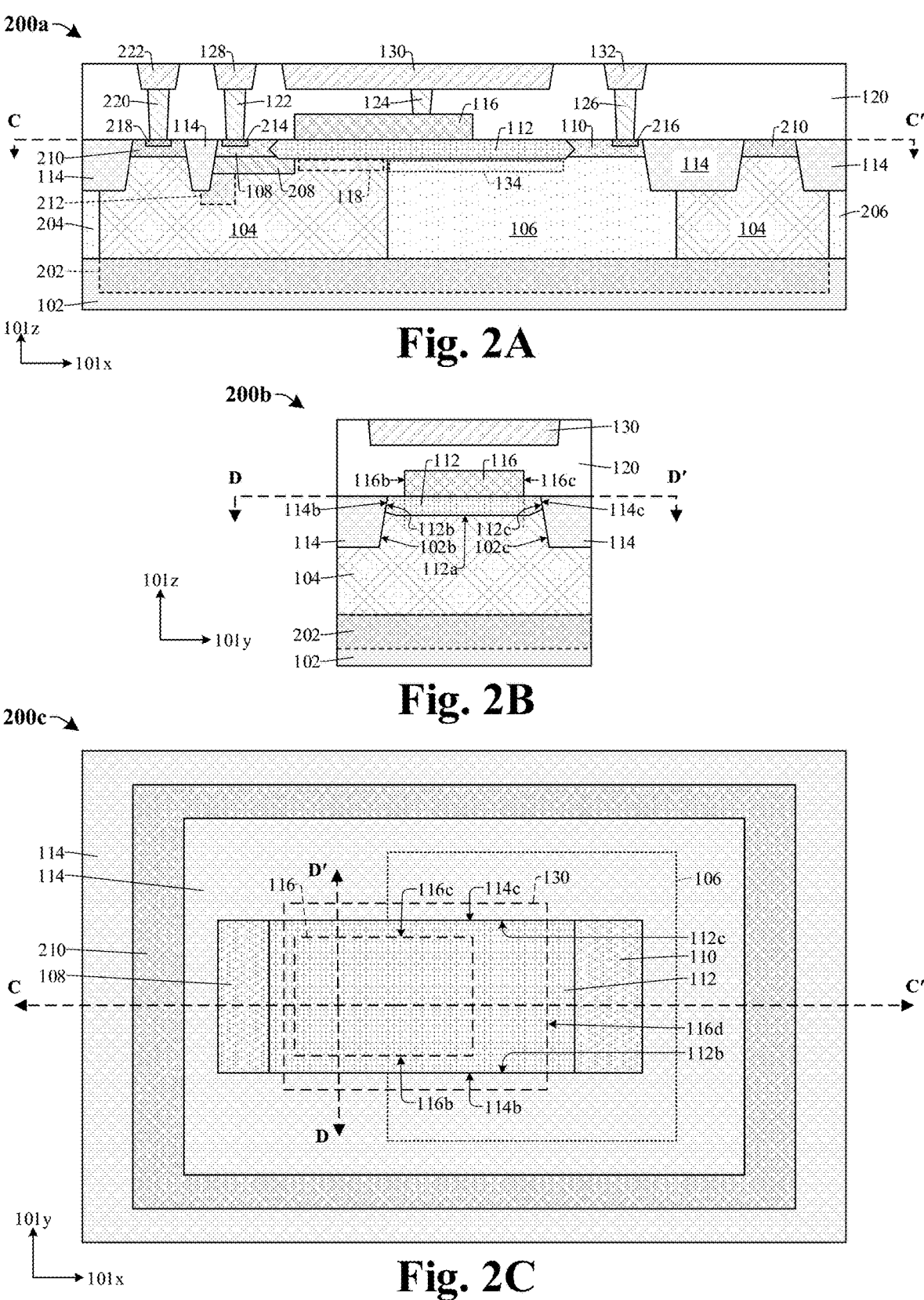
FIGS. 2A-2C illustrate views of some embodiments of the integrated chip of FIG. 1A in which a body region is in the first HV well region.

FIG. 2A illustrates a first cross-sectional view 200*a* of some embodiments of the integrated chip of FIG. 1A in which a body region 210 is in the first HV well region 104. FIG. 2B illustrates a second cross-sectional view 200*b* of some embodiments of the integrated chip of FIG. 2A. FIG. 2C illustrates a top view 200*c* of some embodiments of the integrated chip of FIG. 2A and FIG. 2B.

In some embodiments, cross-sectional view 200*a* of FIG. 2A may be taken across line C-C' of FIG. 2C and/or top view 200*c* of FIG. 2C may be taken across line C-C' of FIG. 2A. In some embodiments, cross-sectional view 200*b* of FIG. 2B may be taken across line D-D' of FIG. 2C and/or top view 200*c* of FIG. 2C may be taken across line D-D' of FIG. 2B.

The body region 210 has the first doping type. The body region 210 is laterally spaced apart from the first source/drain region 108 in the first direction (e.g., along 101*x*). The trench isolation layer 114 extends directly between the first source/drain region 108 and the body region 210. The first HV well region 104 laterally surrounds the second HV well region 106 in a closed path (e.g., a ring-shaped path). The body region 210 extends along the first HV well region 104 and laterally surrounds source/drain regions 108, 110 in a closed path (e.g., a ring-shaped path). The trench isolation layer 114 surrounds the body region 210 in a closed path (e.g., a ring-shaped path).

In some embodiments, a lightly doped (LD) source/drain region 208 having the second doping type is in the first HV well region 104 below the first source/drain region 108. In some embodiments, the LD source/drain region 208 extends along the bottom of the first source/drain region 108 and the bottom surface of the gate dielectric layer 112. In some embodiments, the LD source/drain region 208 extends directly under the gate layer 116. The channel region 118 extends between the LD source/drain region 208 and the interface between the first HV well region 104 and the second HV well region 106. In some embodiments, a well region 212 having the first doping type is in the first HV well region 104 below the LD source/drain region 208.

A third metal interconnect 222 is over the body region 210 and coupled to the body region 210 by a body contact 220. In some embodiments, a silicide region 218 is formed along the body region 210 where the body contact 220 is coupled to the body region 210. Similarly, silicide regions 214, 216 are formed along the source/drain regions 108, 110 where the source/drain contacts 122, 126 are coupled to the source/drain regions 108, 110, respectively.

In some embodiments, a peripheral HV well region 204 having the second doping type is in the substrate 102 on a first side of the first HV well region 104. In addition, a peripheral HV well region 206 having the second doping type is in the substrate 102 on a second side of the first HV well region 104.

The first HV well region 104 has the first doping type. The second HV well region 106 has the second doping type. The source/drain regions 108, 110 have the second doping type. In some embodiments (e.g., in which the first doping type is n-type), the substrate 102 has p-type doping type and the integrated chip further includes a deep well region 202 having the n-type doping in the substrate 102 below the HV well regions 104, 106. For example, the deep well region 202 extends along bottoms of the first HV well region 104 and the second HV well region 106. In some other embodiments (e.g., in which the first doping type is p-type), the substrate 102 has p-type doping and the integrated chip is devoid of the deep well region 202.

In some embodiments, the transistor device illustrated in FIGS. 2A-2C may be referred to as an asymmetric metal-oxide-semiconductor field effect transistor (MOSFET).

Figures 3A, 3B, 3C:
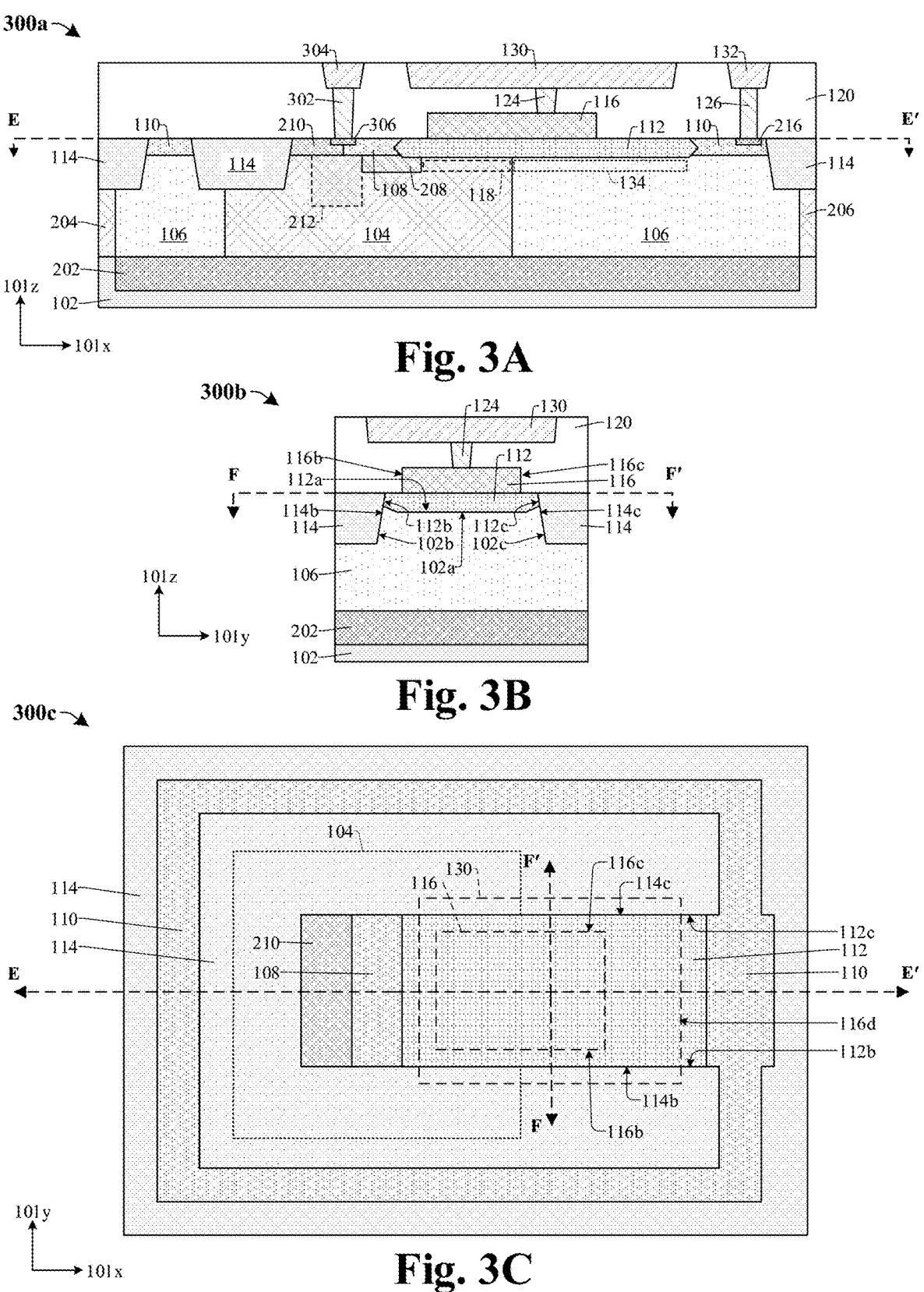
FIGS. 3A-3C illustrate views of some embodiments of the integrated chip of FIG. 1A in which a second source/drain region surrounds a first source/drain region.

FIG. 3A illustrates a first cross-sectional view 300*a* of some embodiments of the integrated chip of FIG. 1A in which the second source/drain region 110 surrounds the first source/drain region 108. FIG. 3B illustrates a second cross-sectional view 300*b* of some embodiments of the integrated chip of FIG. 3A. FIG. 3C illustrates a top view 300*c* of some embodiments of the integrated chip of FIG. 3A and FIG. 3B.

In some embodiments, cross-sectional view 300*a* of FIG. 3A may be taken across line E-E' of FIG. 3C and/or top view 300*c* of FIG. 3C may be taken across line E-E' of FIG. 3A. In some embodiments, cross-sectional view 300*b* of FIG. 3B may be taken across line F-F' of FIG. 3C and/or top view 300c of FIG. 3C may be taken across line F-F' of FIG. 3B.

In some embodiments, the substrate 102 has p-type doping, the deep well region 202 has n-type doping, the first HV well region 104 has p-type doping, the second HV well region 106 has n-type doping, the source/drain regions 108, 110 have n-type doping, the body region 210 has p-type doping, and the LD source/drain region 208 has n-type doping.

The second HV well region 106 surrounds the first HV well region 104 in a closed path (e.g., a ring shaped path). The second source/drain region 110 extends along the second HV well region 106 and laterally surrounds the first source/drain region 108 and the body region 210 in a closed path (e.g., a ring shaped path). The trench isolation layer 114 extends directly between the second source/drain region 110 and the body region 210. The deep well region 202 is disposed in the substrate 102 below the HV well regions 104, 106. The deep well region 202, the second HV well region 106, and the second source/drain region 110 isolate the first HV well region 104, the first source/drain region 108, and the body region 210 from neighboring transistor devices (not shown). Thus, the transistor device illustrated in FIGS. 3A-3C may be referred to as an isolated MOSFET.

In some embodiments, the first source/drain region 108 and the body region 210 are laterally beside one another (e.g., directly contact one another) and a metal line 304 is coupled to both the first source/drain region 108 and the body region 210 by a body/source/drain contact 302. In some embodiments, a silicide region 306 is in both the first source/drain region 108 and the body region 210.

Figures 4A, 4B, 4C:
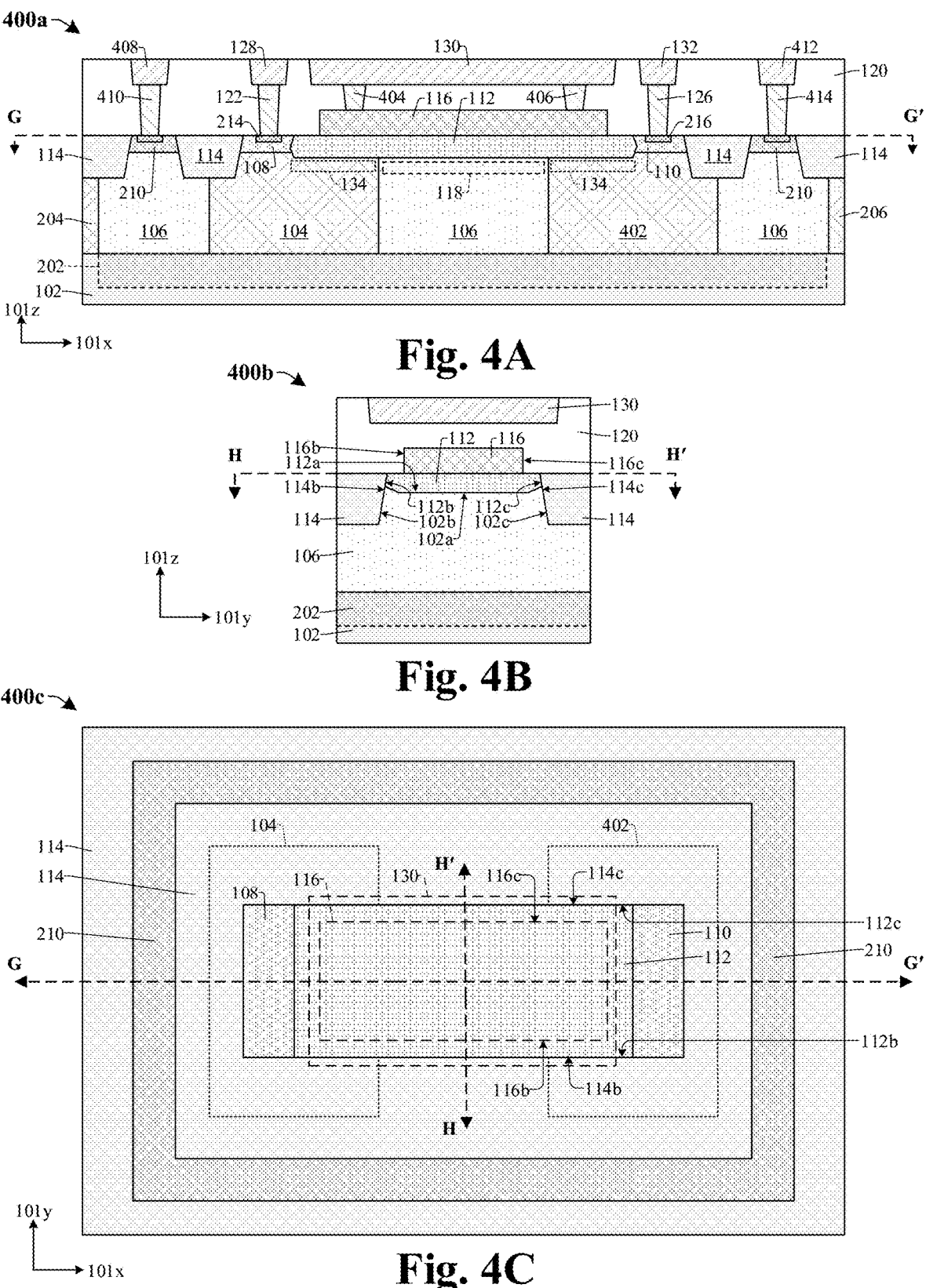
FIGS. 4A-4C illustrate views of some embodiments of the integrated chip of FIG. 1A in which the HV transistor device further includes a third HV well region.

FIG. 4A illustrates a first cross-sectional view 400a of some embodiments of the integrated chip of FIG. 1A in which the HV transistor device further includes a third HV well region 402. FIG. 4B illustrates a second cross-sectional view 400b of some embodiments of the integrated chip of FIG. 4A. FIG. 4C illustrates a top view 400c of some embodiments of the integrated chip of FIG. 4A and FIG. 4B.

In some embodiments, cross-sectional view 400a of FIG. 4A may be taken across line G-G' of FIG. 4C and/or top view 400c of FIG. 4C may be taken across line G-G' of FIG. 4A. In some embodiments, cross-sectional view 400b of FIG. 4B may be taken across line H-H' of FIG. 4C and/or top view 400c of FIG. 4C may be taken across line H-H' of FIG. 4B.

The integrated chip includes the first HV well region 104 having the first doping type, the second HV well region 106 having the second doping type, and a third HV well region 402 having the first doping type. The second HV well region 106 extends directly between both the first HV well region 104 and the third HV well region 402. Further, the second HV well region 106 laterally surrounds both the first HV well region 104 and the third HV well region 402 in a closed path (e.g., a double ring shaped path).

The first source/drain region 108 has the first doping type and is in the first HV well region 104. The second source/drain region 110 has the first doping type and is in the third HV well region 402. The channel region 118 extends along the bottom surface of the gate dielectric layer 112 from an interface between the first HV well region 104 and the second HV well region 106 to an interface between the second HV well region 106 and the third HV well region 402. In some embodiments, a first drift region 134 extends from the first source/drain region 108 to the interface between the first HV well region 104 and the second HV well region 106, and a second drift region 134 extends from the second source/drain region 110 to the interface between the third HV well region 402 and the second HV well region 106.

The body region 210 has the second doping type and is in the second HV well region 106. The body region 210 extends along the second HV well region 106 and laterally surrounds both of the source/drain regions 108, 110 in a closed path (e.g., a ring shaped path). The trench isolation layer 114 extends directly between the first source/drain region 108 and the body region 210. Further, the trench isolation layer 114 extends directly between the second source/drain region 110 and the body region 210.

In some embodiments, the metal field plate 130 is coupled to the gate layer 116 by a first gate contact 404 and a second gate contact 406 that are arranged on opposite sides of the gate layer 116. In some embodiments, a metal line 408 is coupled to the body region 210 on a first side of the transistor device by a first body contact 410 and another metal line 412 is coupled to the body region 210 on a second side of the transistor device by a second body contact 414. In some embodiments, peripheral HV well regions 204, 206 are on opposite sides of the second HV well region 106. The peripheral HV well regions 204, 206 have the first doping type.

In some embodiments, the transistor device is approximately symmetric about a center line (not shown) that extends in the second direction (e.g., along 101y) between the first HV well region 104 and the third HV well region 402. Thus, the transistor device illustrated in FIGS. 4A-4C may be referred to as a symmetric MOSFET.

FIGS. 5A, 5B, 5C through FIGS. 15A, 15B, 15C, illustrate views 500a, 500b, 500c through views 1500a, 1500b, 1500c of some embodiments of a method for forming an integrated chip including a high voltage (HV) transistor device, the HV transistor device including a gate layer that is setback from sidewalls of a gate dielectric layer. Although FIGS. 5A, 5B, 5C through FIGS. 15A, 15B, 15C are described in relation to a method, it will be appreciated that the structures disclosed in FIGS. 5A, 5B, 5C through FIGS. 15A, 15B, 15C are not limited to such a method, but instead may stand alone as structures independent of the method. In some embodiments, cross-sectional views 500a-1500a of FIGS. 5A-15A, respectively, may be taken across line I-I' of FIGS. 5C-15C, respectively, and cross-sectional views 500b-1500b of FIGS. 5B-15B, respectively, may be taken across line J-J' of FIGS. 5C-15C, respectively.

Figures 5A, 5B, 5C:
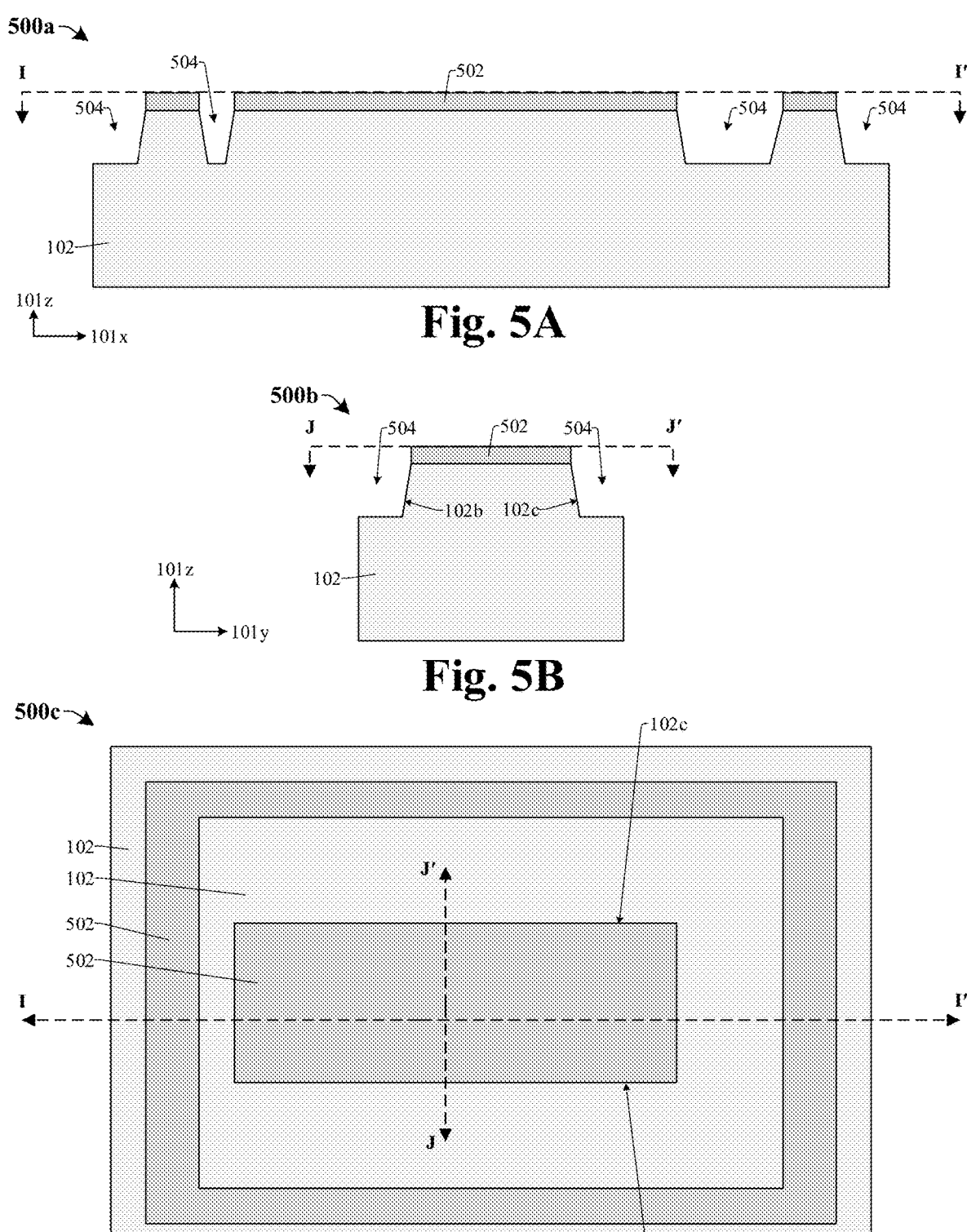

In some embodiments, as shown in cross-sectional view 500a of FIG. 5A, cross-sectional view 500b of FIG. 5B, and top view 500c of FIG. 5C, a semiconductor substrate 102 is etched to form a trench 504 in the substrate 102. The trench 504 is delimited by sidewalls and an upper surface of the substrate 102. In some embodiments, the etching delimits an active region of the substrate 102.

In some embodiments, a masking layer 502 is formed over the substrate and the etching is performed according to the masking layer 502. In some embodiments, the masking layer 502 comprises a photoresist layer, a hard mask layer, or some other suitable layer. In some embodiments, the etching comprises a dry etching process (e.g., a plasma etching process, a reactive ion etching process, an ion beam etching process, or the like) or some other suitable process. In some embodiments, the masking layer 502 is removed during and/or after the etching. In some embodiments, the substrate 102 comprises silicon or some other suitable material.

Figure 6A:
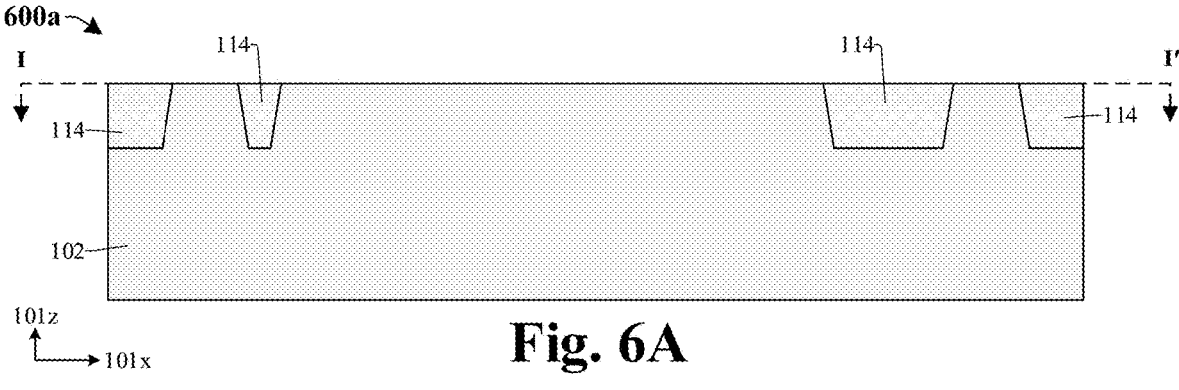
Figure 6B:
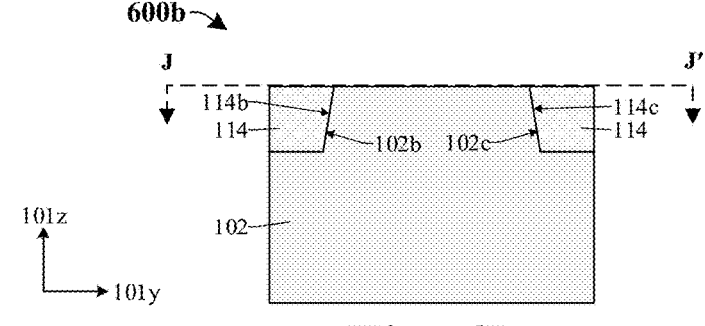
Figure 6C:
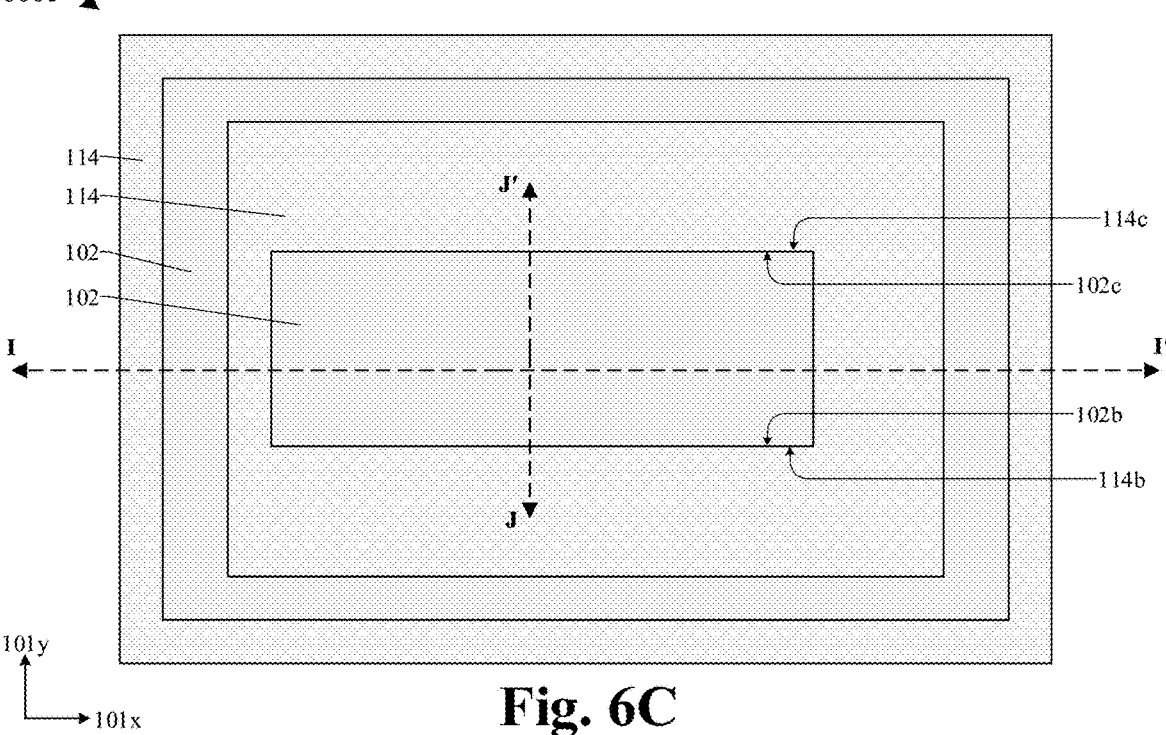

As shown in cross-sectional view 600a of FIG. 6A, cross-sectional view 600b of FIG. 6B, and top view 600c of FIG. 6C, a trench isolation layer 114 is deposited over the substrate 102 and in the trench (e.g., 504 of FIGS. 5A, 5B, 5C). In some embodiments, the trench isolation layer 114 surrounds the active region of the substrate 102. In some embodiments, the trench isolation layer 114 comprises a dielectric such as, for example, silicon dioxide or some other suitable material. In some embodiments, the trench isolation layer 114 is deposited by a chemical vapor deposition (CVD) process, a physical vapor deposition (PVD) process, an atomic layer deposition (ALD) process, or some other suitable process.

Further, a planarization process is performed on the trench isolation layer 114. In some embodiments, the planarization process may for example, comprise a chemical mechanical planarization (CMP) or some other suitable process.

As shown in cross-sectional view 700a of FIG. 7A, cross-sectional view 700b of FIG. 7B, and top view 700c of FIG. 7C, the substrate 102 is etched to form a gate dielectric recess 704 along the top surface of the substrate 102 and between sidewalls of the trench isolation layer 114. In some embodiments, the etching extends into the trench isolation layer 114.

In some embodiments, a hard mask layer 702 is formed over the substrate 102 and the etching is performed according to the hard mask layer 702. In some embodiments, the hard masking layer 702 is etched according to a photoresist layer to delimit the hard mask layer 702 before the substrate 102 is etched according to the hard mask layer 702. In some embodiments, the hard mask layer 702 comprises silicon nitride, a plasma enhanced oxide, or some other suitable material. In some embodiments, the etching comprises a dry etching process or some other suitable process.

Figure 8A:
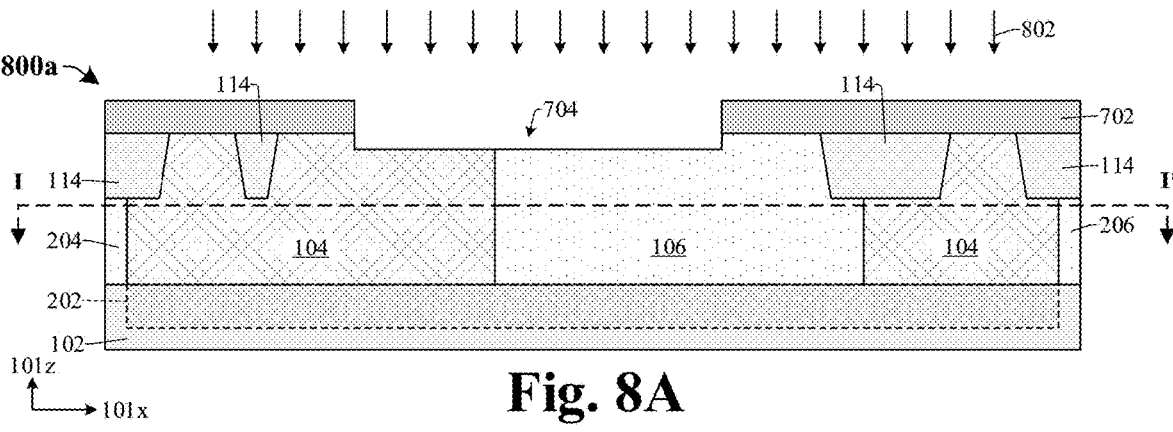
Figure 8B:
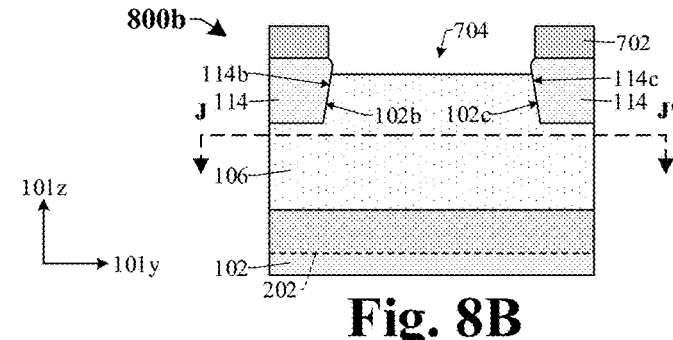
Figure 8C:
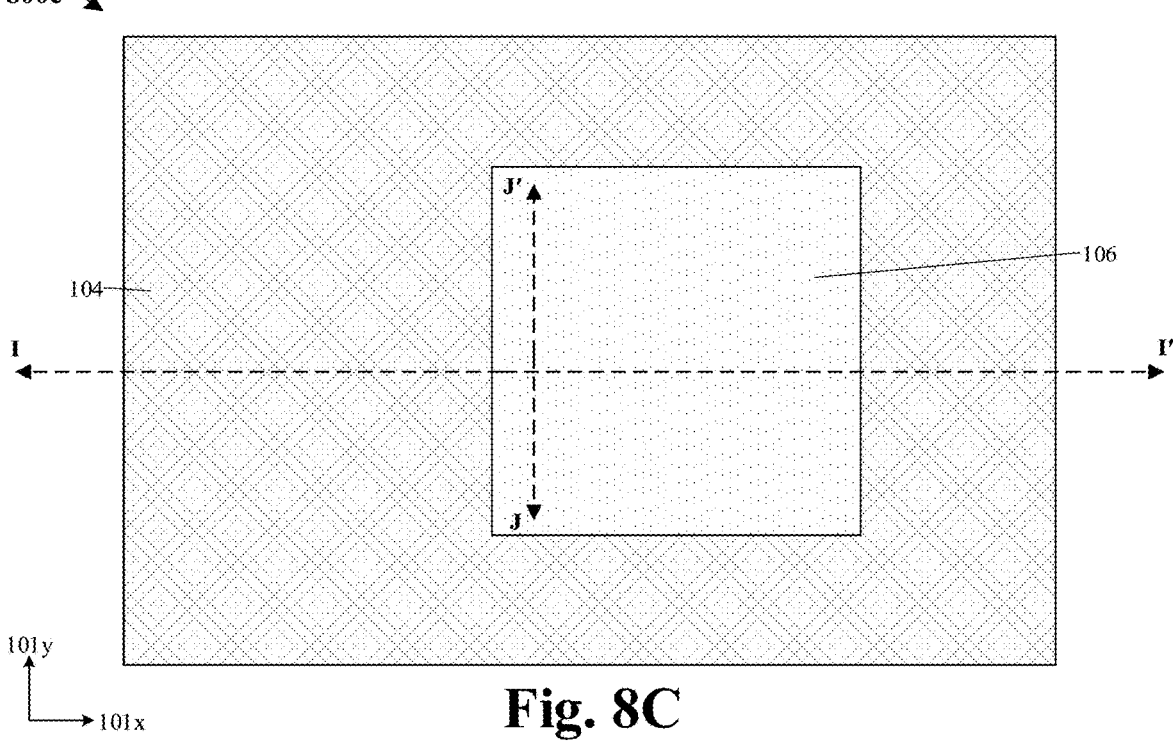

As shown in cross-sectional view 800a of FIG. 8A, cross-sectional view 800b of FIG. 8B, and top view 800c of FIG. 8C, a first HV well region 104 and a second HV well region 106 are formed in the substrate 102 laterally beside one another. In some embodiments, the second HV well region 106 is surrounded by the first HV well region 104. The first HV well region 104 has a first doping type and the second HV well region 106 has a second doping type, different than the first doping type. In some embodiments, the first HV well region 104 and the second HV well region 106 are formed in the substrate 102 by ion implantation processes (e.g., as illustrated by arrows 802) or some other suitable processes. In some embodiments, the hard mask layer 702 remains in place during the formation of the HV well regions 104, 106.

In some embodiments, the substrate has p-type doping. Further, in some embodiments (e.g., in which the first doping type is n-type), a deep well region 202 having n-type doping is formed in the substrate 102 before the first HV well region 104 is formed in the substrate 102. For example, the deep well region 202 may be formed in the substrate 102 by an ion implantation process or some other suitable process. In some other embodiments (e.g., in which the first doping type is p-type), the substrate 102 is devoid of the deep well region 202.

In some embodiments, peripheral HV wells 204, 206 are formed in the substrate on opposite sides of the first HV well region 104. The peripheral HV wells 206, 206 are not shown in top view 800c of FIG. 8C.

Figure 9A:
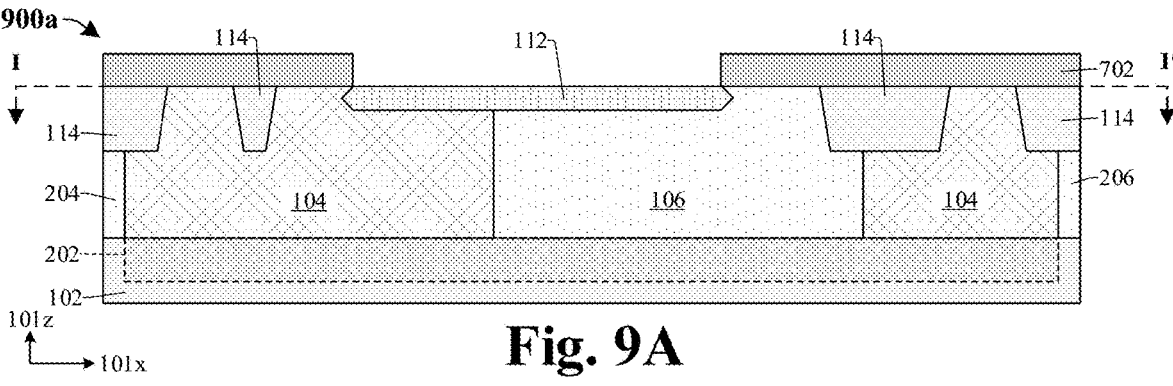
Figure 9B:
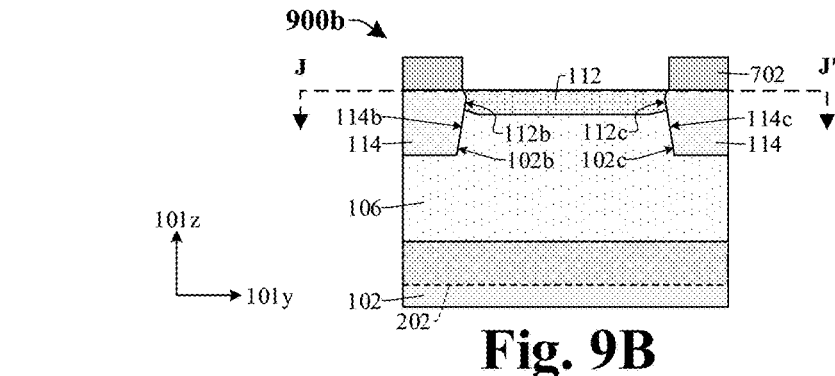
Figure 9C:
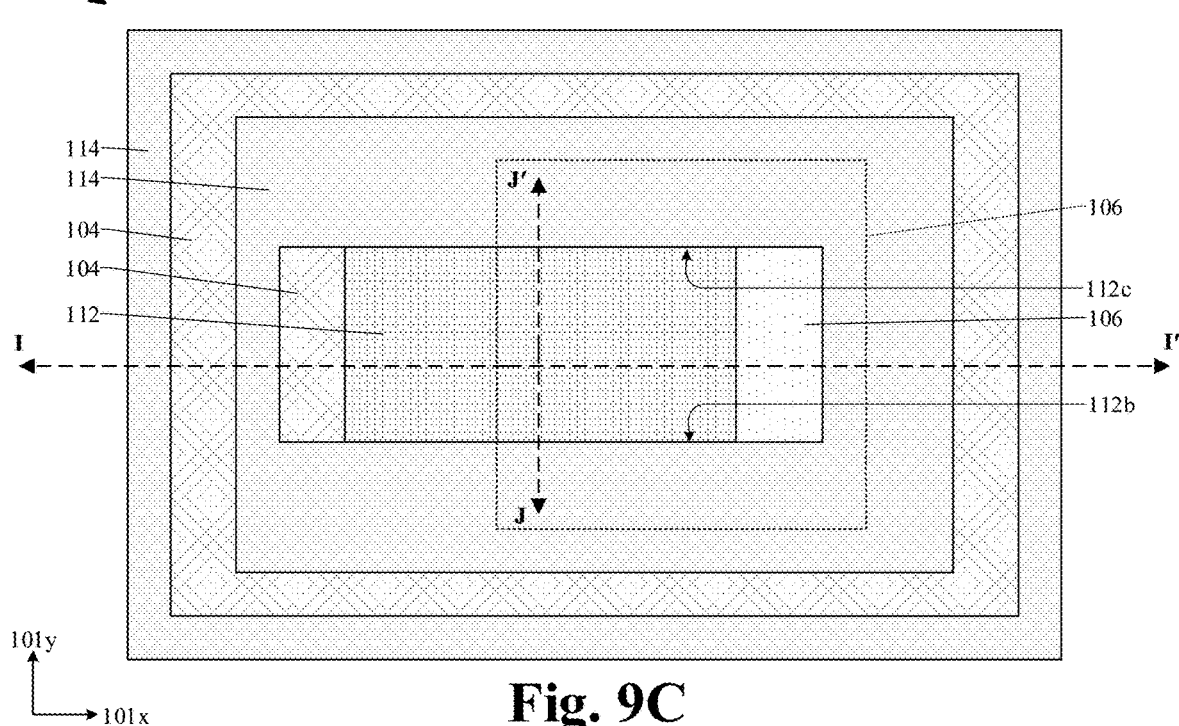

As shown in cross-sectional view 900a of FIG. 9A, cross-sectional view 900b of FIG. 9B, and top view 900c of FIG. 9C, a gate dielectric layer 112 is formed over the substrate 102 in the gate dielectric recess (e.g., 704 of FIGS. 8A, 8B, 8C). In some embodiments, the gate dielectric layer 112 is formed by a thermal oxide growth process in which a thermal oxide layer is grown over the substrate 102 in the recess. In some embodiments, the hard mask layer 702 remains in place during the formation of the gate dielectric layer 112. In some embodiments, exposed portions of the substrate 102 are oxidized during the thermal oxide growth process. In some embodiments, the hard mask layer 702 is removed after the thermal oxide growth process. In some embodiments, the gate dielectric layer 112 comprises silicon dioxide or some other suitable material.

In some embodiments, the thermal oxide growth process may behave differently along the trench isolation layer 114 than along the substrate 102. As a result, the thickness of the gate dielectric layer 112 along the trench isolation layer 114 (e.g., along sidewalls 114b, 114c) may be substantially less than an average thickness of the gate dielectric layer 112. Thus, a minimum distance between the substrate 102 and a top surface of the gate dielectric layer 112 may be reduced along the sidewalls 112b, 112c of the gate dielectric layer 112.

Figure 10A:
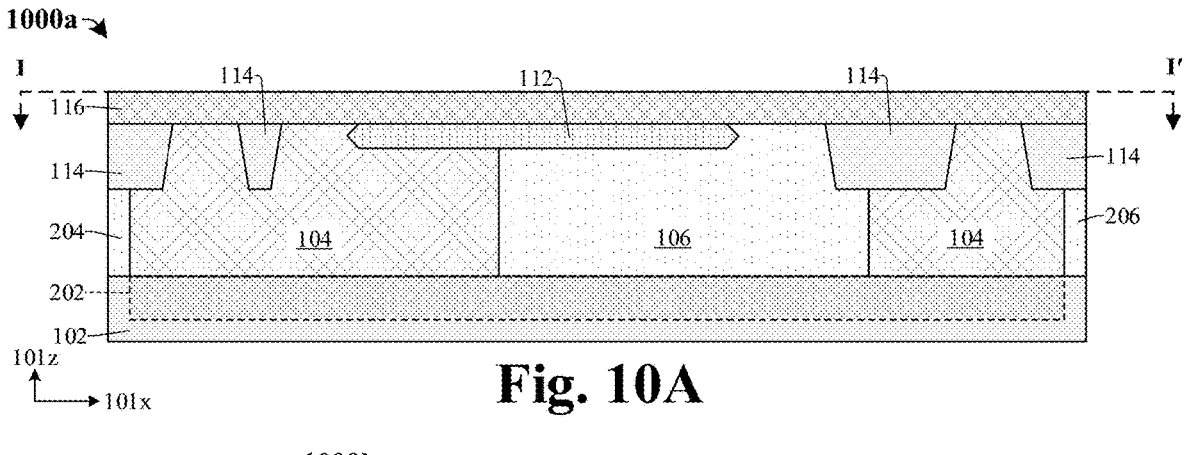
Figure 10B:
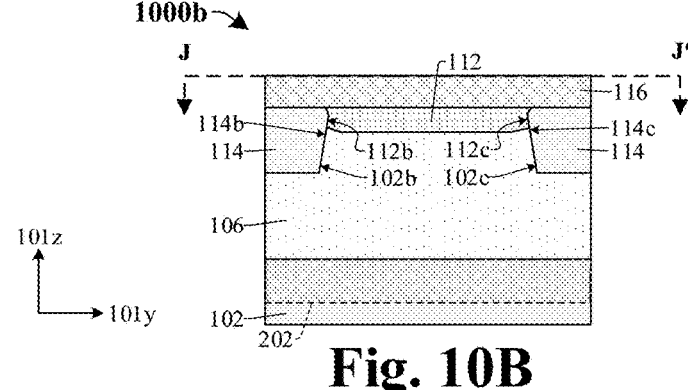
Figure 10C:
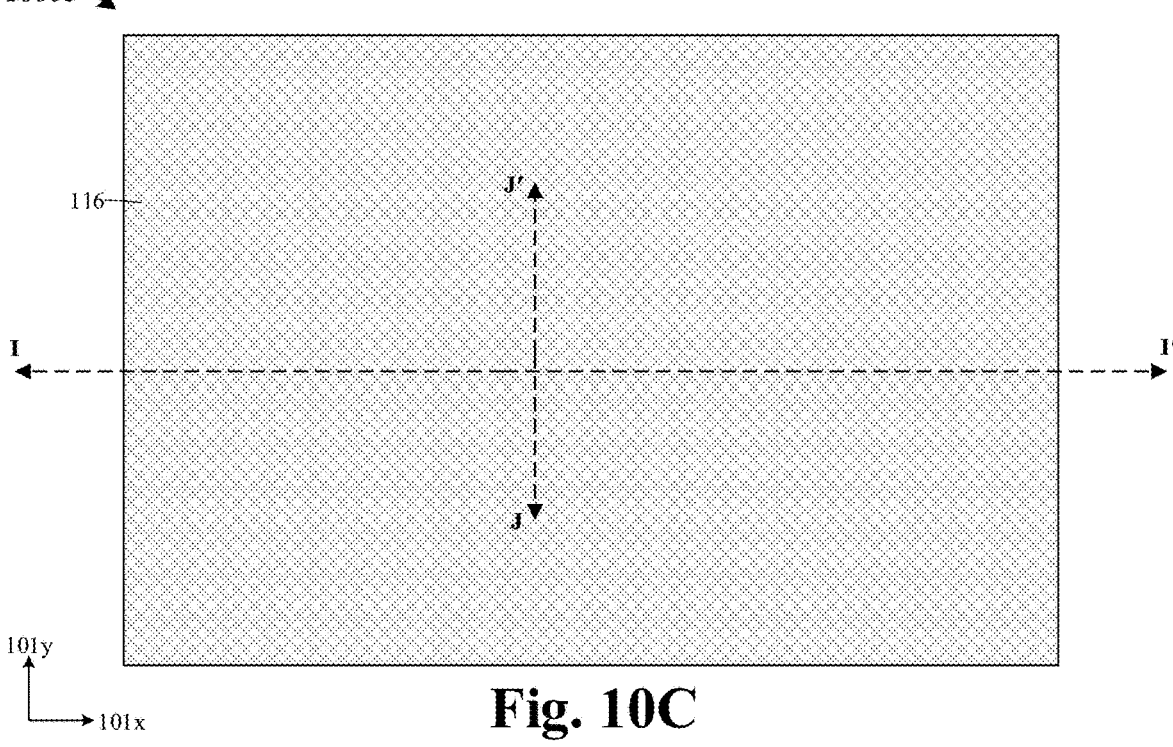

As shown in cross-sectional view 1000a of FIG. 10A, cross-sectional view 1000b of FIG. 10B, and top view 1000c of FIG. 10C, a gate layer 116 is deposited over the substrate 102, the gate dielectric layer 112, and the trench isolation layer 114. In some embodiments, the gate layer 116 comprises polysilicon, a metal, or some other suitable material. In some embodiments, the gate layer 116 is deposited by a CVD process, a PVD process, an ALD process, or some other suitable process.

As shown in cross-sectional view 1100a of FIG. 11A, cross-sectional view 1100b of FIG. 11B, and top view 1100c of FIG. 11C, the gate layer 116 is etched to delimit the gate layer 116. For example, the gate layer 116 has a first sidewall 116b and a second sidewall 116c directly over the gate dielectric layer 112 and laterally offset (e.g., setback) from the sidewalls 112b, 112c of the gate dielectric layer 112 (where the gate dielectric layer 112 has reduced thickness) as a result of the etching. By etching the gate layer 116 so that the sidewalls 116b, 116c of the gate layer 116 are directly over the gate dielectric layer 112 and laterally setback from the sidewalls 112b, 112c of the gate dielectric layer 112, the gate layer 116 does not extend over the region of the gate dielectric layer 112 having the reduced thickness. Thus, a reliability of the device can be improved.

In some embodiments, a masking layer 1102 is formed over the gate layer 116 and the etching is performed according to the masking layer 1102. The masking layer 1102 has sidewalls that are directly over the gate dielectric layer 112 and laterally offset from the sidewalls 112b, 112c of the gate dielectric layer 112 so that the gate layer 116 has similar features after the etching. In some embodiments, the masking layer 1102 comprises a photoresist layer, a hard mask layer, or some other suitable layer. In some embodiments, the etching comprises a dry etching process or some other suitable process. In some embodiments, the masking layer 1102 is removed during and/or after the etching.

As shown in cross-sectional view 1200a of FIG. 12A, cross-sectional view 1200b of FIG. 12B, and top view 1200c of FIG. 12C, a first source/drain region 108 is formed in the first HV well region 104. Further, a second source/drain region 110 is formed in the second HV well region 106. In some embodiments, the source/drain regions 110 have the second doping type. Furthermore, a body region 210 is formed in the first HV well region 104. In some embodiments, the body region 210 has the first doping type. In some embodiments, the source/drain regions 108, 110 and the body region 210 are formed by ion implantation processes (e.g., as illustrated by arrows 1202) or some other suitable process.

In some embodiments, an lightly doped (LD) source/drain region 208 is formed (e.g., by an ion implantation process) in the first HV well region 104 before the first source/drain region 108 is formed in the first HV well region 104 and the first source/drain region 108 is subsequently formed over the LD source/drain region 208.

Figures 13A, 13B, 13C:
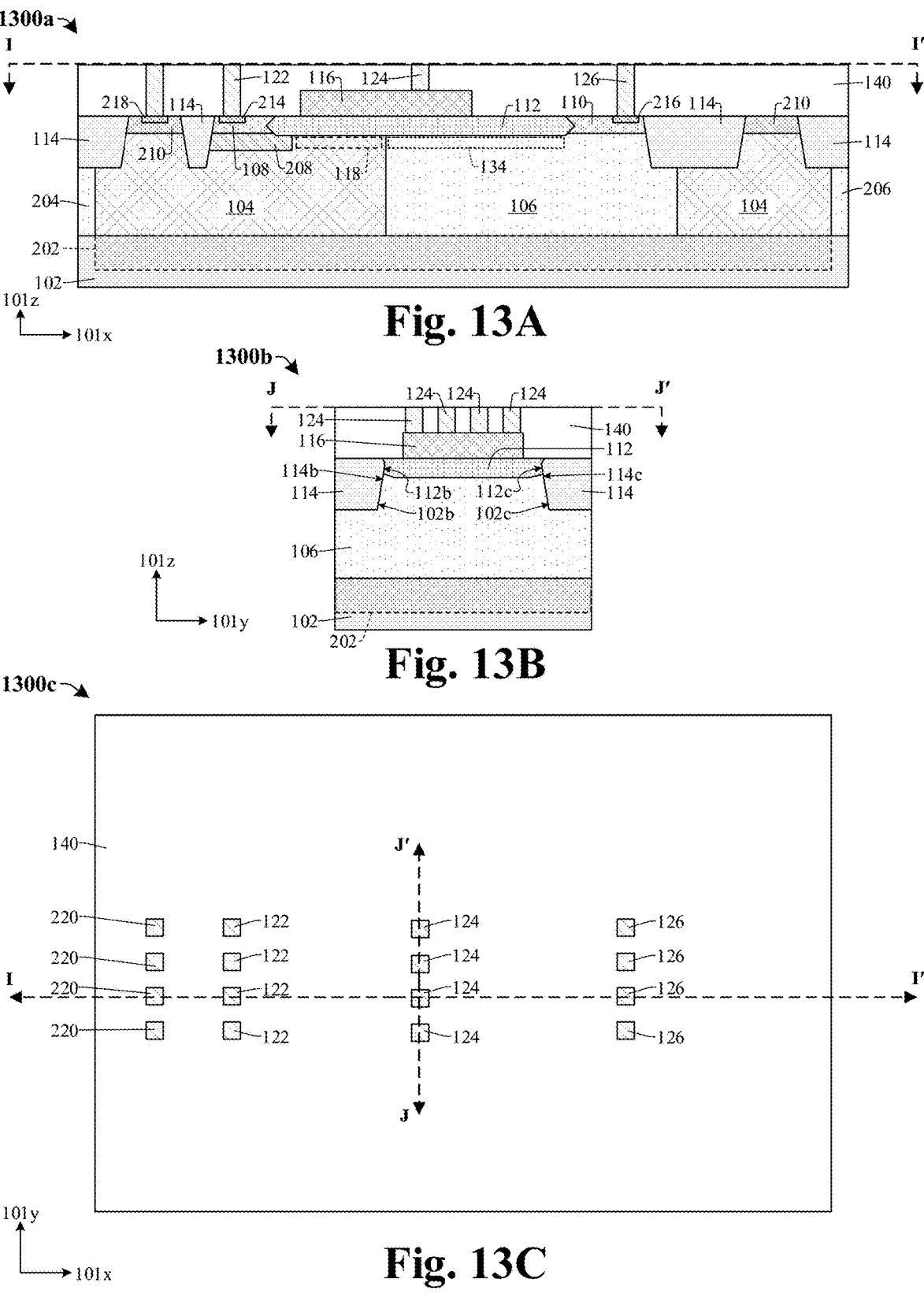

As shown in cross-sectional view 1300a of FIG. 13A, cross-sectional view 1300b of FIG. 13B, and top view 1300c of FIG. 13C, a first dielectric layer 140 is deposited over the substrate 102 and contacts 122, 124, 126, 220 are formed within the first dielectric layer 140. For example, first source/drain contacts 122 are formed over the first source/drain region 108 and directly contact the first source/drain region 108. Second source/drain contacts 126 are formed over the second source/drain region 110 and directly contact the second source/drain region 110. Body contacts 220 are formed over the body region 210 and directly contact the body region 210. Gate contacts 124 are formed over the gate layer 116 and directly contact the gate layer 116.

In some embodiments, the first dielectric layer 140 comprises silicon dioxide or some other suitable material. In some embodiments, the first dielectric layer 140 is deposited by a CVD process, a PVD process, an ALD process, or some other suitable process. In some embodiments, the contacts 122, 124, 126, 220 are formed in the first dielectric layer 140 by etching the first dielectric layer 140, depositing a contact material (e.g., tungsten or the like) over the etched first dielectric layer 140, and performing a planarization process (e.g., a CMP or the like) on the contact material.

Figures 14A, 14B, 14C:
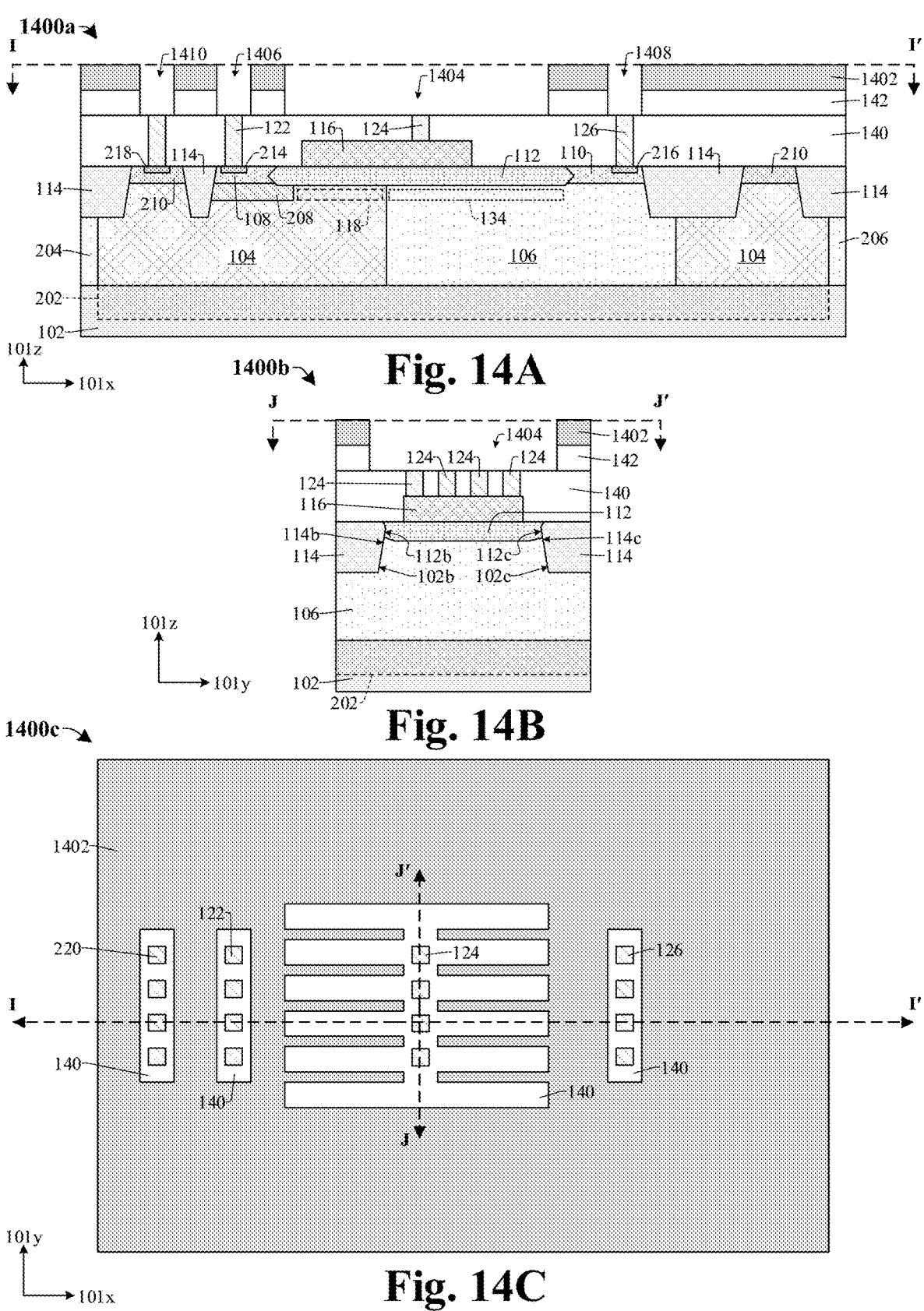

As shown in cross-sectional view 1400a of FIG. 14A, cross-sectional view 1400b of FIG. 14B, and top view 1400c of FIG. 14C, a second dielectric layer 142 is deposited over the first dielectric layer 140 and over the contacts 122, 124, 126, 220. In some embodiments, the second dielectric layer 142 comprises silicon dioxide or some other suitable material. In some embodiments, the second dielectric layer 142 is deposited by a CVD process, a PVD process, an ALD process, or some other suitable process.

Further, the second dielectric layer 142 is etched to form interconnect openings 1406, 1408, 1410 and a field plate opening 1404 in the second dielectric layer and over the contacts 122, 126, 220, 124. For example, a first interconnect opening 1406 is formed in the second dielectric layer 142 directly over the first source/drain contacts 122, a second interconnect opening 1408 is formed in the second dielectric layer 142 directly over the second source/drain contacts 126, and a third interconnect opening 1410 is formed in the second dielectric layer 142 directly over the body contacts 220. Further, the field plate opening 1404 is formed in the second dielectric layer 142 directly over the gate contacts 124. In some embodiments, a masking layer 1402 is formed over the second dielectric layer 142 and the etching is performed according to the masking layer 1402.

A sidewall of the second dielectric layer 142 that delimits the field plate opening 1404 is directly over the second HV well region 106 and laterally spaced apart from a third sidewall 116d of the gate layer 116 in the first direction (e.g., along x-axis 101x). Thus, when a metal field plate (e.g., 130 of FIGS. 15A, 15B, 15C) is subsequently formed in the field plate opening 1404, the metal field plate will extend beyond the third sidewall 116d of the gate layer 116 and directly over the second HV well region 106 (e.g., directly over the drift region 134). As a result, a breakdown voltage of the device can be improved.

Figures 15A, 15B, 15C:
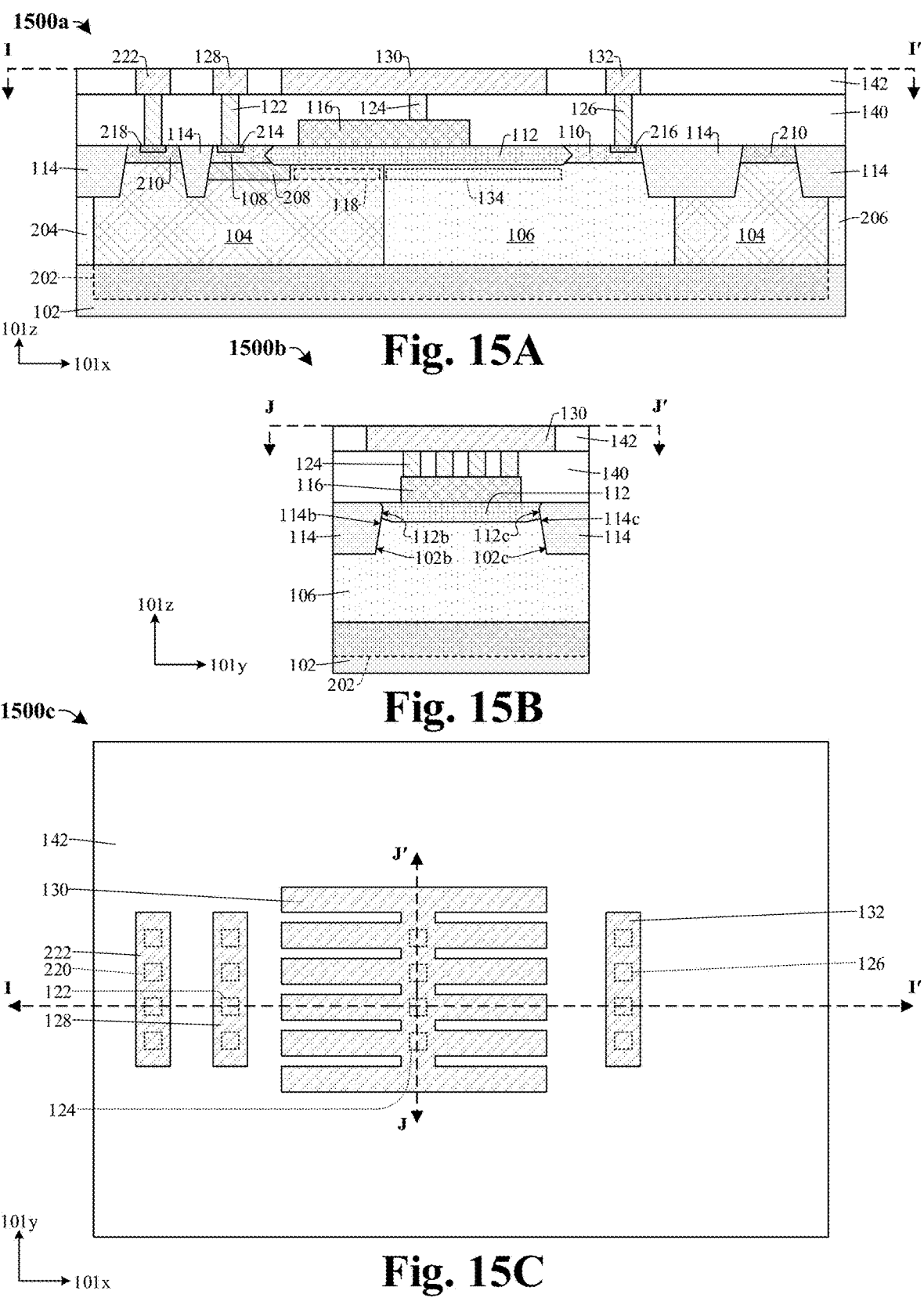

As shown in cross-sectional view 1500a of FIG. 15A, cross-sectional view 1500b of FIG. 15B, and top view 1500c of FIG. 15C, a metal field plate 130 is formed in the field plate opening (e.g., 1404 of FIGS. 14A, 14B, 14C) over the gate contact 124. In addition, metal interconnects 128, 132, 222 are formed in the interconnect openings (e.g., 1406, 1408, 1410 of FIGS. 14A, 14B, 14C), respectively. In some embodiments, the metal field plate 130 and the metal interconnects 128, 132, 222 are formed by depositing a metal (e.g., copper, aluminum, or the like) over the second dielectric layer 142 and in the interconnect openings. Further, a planarization process is performed on the metal. In some embodiments, the metal field plate 130 includes a plurality of metal segments that extend in the first direction (e.g., along x-axis 101x), that are spaced apart in the second direction (e.g., along y-axis 101y), and that are connected together by a connecting segment that extends in the second direction.

FIG. 16 illustrates a flow diagram of some embodiments of a method 1600 for forming an integrated chip including a high voltage (HV) transistor device, the HV transistor device including a gate layer that is setback from sidewalls of a gate dielectric layer. While method 1600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 1602, etch a substrate to form a trench in the substrate, the trench laterally surrounding an active region of the substrate. FIG. 5A illustrates a cross-sectional view 500a, FIG. 5B illustrates a cross-sectional view 500b, and FIG. 5C illustrates a top view 500c of some embodiments corresponding to block 1602.

At block 1604, deposit a trench isolation layer in the trench. FIG. 6A illustrates a cross-sectional view 600a, FIG. 6B illustrates a cross-sectional view 600b, and FIG. 6C illustrates a top view 600c of some embodiments corresponding to block 1604.

At block 1606, etch the substrate to form a recess in the substrate between sidewalls of the trench isolation layer. FIG. 7A illustrates a cross-sectional view 700a, FIG. 7B illustrates a cross-sectional view 700b, and FIG. 7C illustrates a top view 700c of some embodiments corresponding to block 1606.

At block 1608, form a first high voltage (HV) well region having a first doping type in the substrate below the recess. FIG. 8A illustrates a cross-sectional view 800a, FIG. 8B illustrates a cross-sectional view 800b, and FIG. 8C illustrates a top view 800c of some embodiments corresponding to block 1608.

At block 1610, form a second HV well region having a second doping type in the substrate beside the first HV well region and below the recess. FIG. 8A illustrates a cross-sectional view 800a, FIG. 8B illustrates a cross-sectional view 800b, and FIG. 8C illustrates a top view 800c of some embodiments corresponding to block 1610.

At block 1612, form a gate dielectric layer in the recess between the sidewalls of the trench isolation layer. FIG. 9A illustrates a cross-sectional view 900a, FIG. 9B illustrates a cross-sectional view 900b, and FIG. 9C illustrates a top view 900c of some embodiments corresponding to block 1612.

At block 1614, deposit a gate layer over the gate dielectric layer. FIG. 10A illustrates a cross-sectional view 1000*a*, FIG. 10B illustrates a cross-sectional view 1000*b*, and FIG. 10C illustrates a top view 1000*c* of some embodiments corresponding to block 1614.

At block 1616, etch the gate layer so that sidewalls of the gate layer are directly over the gate dielectric layer and laterally setback from sidewalls of the gate dielectric layer. FIG. 11A illustrates a cross-sectional view 1100*a*, FIG. 11B illustrates a cross-sectional view 1100*b*, and FIG. 11C illustrates a top view 1100*c* of some embodiments corresponding to block 1616.

At block 1618, form a first source/drain region having the second doping type in the first HV well region. FIG. 12A illustrates a cross-sectional view 1200*a*, FIG. 12B illustrates a cross-sectional view 1200*b*, and FIG. 12C illustrates a top view 1200*c* of some embodiments corresponding to block 1618.

At block 1620, form a second source/drain region having the second doping type in the second HV well region. FIG. 12A illustrates a cross-sectional view 1200*a*, FIG. 12B illustrates a cross-sectional view 1200*b*, and FIG. 12C illustrates a top view 1200*c* of some embodiments corresponding to block 1620.

At block 1622, form a metal field plate directly over the gate layer and coupled to the gate layer, the metal field plate extending toward the second source/drain region beyond a sidewall of the gate layer. FIG. 15A illustrates a cross-sectional view 1500*a*, FIG. 15B illustrates a cross-sectional view 1500*b*, and FIG. 15C illustrates a top view 1500*c* of some embodiments corresponding to block 1622.

Thus, the present disclosure relates to a high voltage (HV) transistor device and a method for forming the HV transistor device, the device comprising a gate layer that is laterally setback from sidewalls of an underlying gate dielectric layer to improve a reliability of the device.

Accordingly, in some embodiments, the present disclosure relates to an integrated chip including a semiconductor substrate. A first source/drain region and a second source/drain region are in the semiconductor substrate and laterally spaced apart along a top surface of the semiconductor substrate. A gate dielectric layer is over the semiconductor substrate and extends laterally between the first source/drain region and the second source/drain region. A thickness of the gate dielectric layer along a first sidewall of the gate dielectric layer is less than an average thickness of the gate dielectric layer. A trench isolation layer extends along gate dielectric layer on opposite sides of the gate dielectric layer. A first sidewall of the trench isolation layer extends along the first sidewall of the gate dielectric layer. A gate layer is directly over the gate dielectric layer and between the first source/drain region and the second source/drain region. A first sidewall of the gate layer is directly over the gate dielectric layer and laterally setback from the first sidewall of the gate dielectric layer.

In other embodiments, the present disclosure relates to an integrated chip including a semiconductor substrate and a first high voltage (HV) well region in the semiconductor substrate. The first HV well region has a first doping type. A second HV well region is in the semiconductor substrate and laterally beside the first HV well region. The second HV well region has a second doping type, different than the first doping type. A first source/drain region is in the first HV well region and along a top surface of the semiconductor substrate. The first source/drain region has the second doping type. A second source/drain region is in the second HV well region, along the top surface of the semiconductor substrate, and laterally spaced apart from the first source/drain region in a first direction. The second source/drain region has the second doping type. A gate dielectric layer is over the first HV well region, over the second HV well region, and laterally between the first source/drain region and the second source/drain region. The gate dielectric layer has a first gate dielectric sidewall and a second gate dielectric sidewall that extend in the first direction and are laterally spaced apart in a second direction, different than the first direction. A trench isolation layer extends in the first direction on opposite sides of the gate dielectric layer. The trench isolation layer has a first isolation sidewall extending in the first direction along the first gate dielectric sidewall and a second isolation sidewall extending in the first direction along the second gate dielectric sidewall. The first isolation sidewall and the second isolation sidewall are laterally spaced apart in the second direction. A gate layer directly is over the gate dielectric layer and between the first source/drain region and the second source/drain region. The gate layer has a first gate sidewall and a second gate sidewall that extend in the first direction and are laterally spaced apart in the second direction. A metal field plate is directly over the gate layer and coupled to the gate layer. The first gate sidewall and the second gate sidewall are directly over the gate dielectric layer and are laterally spaced apart from the first isolation sidewall and the second isolation sidewall, respectively, in the second direction.

In yet other embodiments, the present disclosure relates to a method for forming an integrated chip. The method includes etching a semiconductor substrate to form a trench in the semiconductor substrate. The trench is delimited by a first sidewall of the semiconductor substrate and a second sidewall of the semiconductor substrate. The trench surrounds an active region of the semiconductor substrate. A trench isolation layer is deposited in the trench. A first sidewall of the trench isolation layer extends along the first sidewall of the semiconductor substrate and a second sidewall of the trench isolation layer extends along the second sidewall of the semiconductor substrate. A first high voltage (HV) well region is formed in the semiconductor substrate. The first HV well region has a first doping type. A second HV well region is formed in the semiconductor substrate beside the first HV well region. The second HV well region has a second doping type, different than the first doping type. A gate dielectric layer is formed over the first HV well region, over the second HV well region, and laterally between the first sidewall of the trench isolation layer and the second sidewall of the trench isolation layer. The gate dielectric layer has a first sidewall that extends along the first sidewall of the trench isolation layer and a second sidewall that extends along the second sidewall of the trench isolation layer. A thickness of the gate dielectric layer along the first sidewall of the gate dielectric layer is less than an average thickness of the gate dielectric layer. A gate layer is deposited over the gate dielectric layer. The gate layer is etched so that a first sidewall of the gate layer is directly over the gate dielectric layer and laterally setback from the first sidewall of the gate dielectric layer. A first source/drain region is formed in the first HV well region. The first source/drain region has the second doping type. A second source/drain region is formed in the second HV well region. The second source/drain region has the second doping type. A metal field plate is formed directly over the gate layer and coupled to the gate layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:

etching a semiconductor substrate to form a trench in the semiconductor substrate, wherein the trench is delimited by a first sidewall of the semiconductor substrate and a second sidewall of the semiconductor substrate, and wherein the trench surrounds an active region of the semiconductor substrate;

depositing a trench isolation layer in the trench, wherein a first sidewall of the trench isolation layer extends along the first sidewall of the semiconductor substrate and a second sidewall of the trench isolation layer extends along the second sidewall of the semiconductor substrate;

forming a first high voltage (HV) well region in the semiconductor substrate, the first HV well region having a first doping type;

forming a second HV well region in the semiconductor substrate beside the first HV well region, the second HV well region having a second doping type, different than the first doping type;

forming a gate dielectric layer over the first HV well region, over the second HV well region, and laterally between the first sidewall of the trench isolation layer and the second sidewall of the trench isolation layer, the gate dielectric layer having a first sidewall that extends along the first sidewall of the trench isolation layer and a second sidewall that extends along the second sidewall of the trench isolation layer, wherein a thickness of the gate dielectric layer along the first sidewall of the gate dielectric layer is less than an average thickness of the gate dielectric layer;

depositing a gate layer over the gate dielectric layer;

etching the gate layer so that a first sidewall of the gate layer is directly over the gate dielectric layer and laterally setback from the first sidewall of the gate dielectric layer;

forming a first source/drain region in the first HV well region, the first source/drain region having the second doping type;

forming a second source/drain region in the second HV well region, the second source/drain region having the second doping type; and forming a metal field plate directly over the gate layer and coupled to the gate layer.

2. The method of claim 1, further comprising:

etching the semiconductor substrate between the first sidewall and the second sidewall of the trench isolation layer to form a recess in the semiconductor substrate before forming the first HV well region in the semiconductor substrate, wherein the gate dielectric layer is formed in the recess, and wherein the forming the gate dielectric layer comprises performing a thermal oxide growth process.

3. The method of claim 1, wherein the first source/drain region and the second source/drain region are laterally spaced apart in a first direction, wherein the first sidewall of the gate dielectric layer, the first sidewall of the trench isolation layer, and the first sidewall of the gate layer extend in the first direction, and wherein the first sidewall of the gate layer is laterally setback from the first sidewall of the gate dielectric layer in a second direction, different than the first direction.

4. The method of claim 1, wherein the metal field plate extends toward the second source/drain region beyond the gate layer and directly over the second HV well region.

5. The method of claim 1, wherein the metal field plate comprises a plurality of metal segments that extend in a first direction, are spaced apart in a second direction, and are connected by a connecting segment that extends in the second direction.

6. The method of claim 1, further comprising:

forming a body region having the first doping type in first HV well region, wherein the trench isolation layer separates the first source/drain region from the body region, and wherein the body region laterally surrounds the first source/drain region, the second source/drain region, and the trench isolation layer.

7. A method for forming an integrated chip, the method comprising:

forming a trench isolation layer surrounding an active area of a semiconductor substrate;

etching the active area of the semiconductor substrate to form a gate dielectric recess in the active area of the semiconductor substrate, wherein the trench isolation layer surrounds the gate dielectric recess, and wherein a first sidewall of the trench isolation layer partially forms the gate dielectric recess;

forming a gate dielectric layer in the gate dielectric recess, wherein a first sidewall of the gate dielectric layer extends along the first sidewall of the trench isolation layer;

depositing a gate layer over the gate dielectric layer;

etching the gate layer to form a first sidewall of the gate layer, a bottom of the first sidewall of the gate layer being over a topmost surface of the gate dielectric layer and offset from the first sidewall of the gate dielectric layer; and forming a first source/drain region and a second source/drain region in the semiconductor substrate, wherein the gate dielectric layer is laterally between the first source/drain region and the second source/drain region.

8. The method of claim 7, wherein a bottommost surface of of the gate layer is over the topmost surface of the gate dielectric layer.

9. The method of claim 7, further comprising:

forming a metal field plate over and coupled to the gate layer, wherein the metal field plate covers the gate layer when viewed in top view.

10. The method of claim 9, further comprising:

forming a plurality of contacts on and coupled to the gate layer, wherein the metal field plate is formed on and coupled to the plurality of contacts.

11. The method of claim 7, wherein the gate dielectric layer is formed in the gate dielectric recess by a thermal oxidation process.

12. The method of claim 7, wherein a distance between a top of the first sidewall of the gate dielectric layer and a bottom of the first sidewall of the gate dielectric layer is less than an average distance between the topmost surface of the gate dielectric layer and a bottom surface of the gate dielectric layer.

13. The method of claim 7, further comprising:

forming a first well region and a second well region in the semiconductor substrate, wherein the first and second source/drain regions are formed in the first and second well regions, respectively, and wherein the gate dielectric recess is formed in the first and second well regions.

14. The method of claim 13, wherein the first well region laterally surrounds the second well region.

15. A method of forming an integrated chip, the method comprising:

forming a gate dielectric layer over a portion of a semiconductor substrate and laterally between a first source/drain region and a second source/drain region of the semiconductor substrate, wherein a thickness of the gate dielectric layer along a first sidewall of the gate dielectric layer is less than an average thickness of the gate dielectric layer;

forming a trench isolation layer surrounding the portion of the semiconductor substrate, wherein a first sidewall of the trench isolation layer extends along the first sidewall of the gate dielectric layer and a first sidewall of the semiconductor substrate; and forming a gate layer on the gate dielectric layer and between the first source/drain region and the second source/drain region, wherein an upper surface of the gate dielectric layer extends laterally from a top of the first sidewall of the gate dielectric layer to a bottom of a first sidewall of the gate layer, and wherein a top of the first sidewall of the semiconductor substrate is under a bottom of the first sidewall of the gate dielectric layer and over a bottommost surface of the gate dielectric layer.

16. The method of claim 15, further comprising:

forming a metal field plate over the gate layer, wherein a perimeter of the metal field plate surrounds a perimeter of the gate layer in top view.

17. The method of claim 16, wherein the metal field plate extends over the first sidewall of the gate layer, the first sidewall of the gate dielectric layer, and the first sidewall of the trench isolation layer.

18. The method of claim 15, wherein the first source/drain region extends along a second sidewall of the gate dielectric layer, and wherein the second source/drain region extends along a third sidewall of the gate dielectric layer.

19. The method of claim 15, further comprising:

forming the first source/drain region and the second source/drain region in the semiconductor substrate, wherein the first source/drain region and the second source/drain region extend along the first sidewall of the trench isolation layer.

20. The method of claim 19, further comprising:

forming a first well region and a second well region in the semiconductor substrate, wherein the first well region laterally surrounds the second well region, wherein the first source/drain region is formed in the first well region, wherein the second source/drain region is formed in the second well region, wherein the first well region has a first doping type, and wherein the second well region, the first source/drain region, and the second source/drain region have a second doping type different than the first doping type.

* * * * *